US010283190B1

(12) United States Patent
Li

(10) Patent No.: US 10,283,190 B1
(45) Date of Patent: May 7, 2019

(54) TRANSPOSE NON-VOLATILE (NV) MEMORY (NVM) BIT CELLS AND RELATED DATA ARRAYS CONFIGURED FOR ROW AND COLUMN, TRANSPOSE ACCESS OPERATIONS

(71) Applicant: QUALCOMM Incorporated, San Diego, CA (US)

(72) Inventor: Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/845,722

(22) Filed: Dec. 18, 2017

(51) Int. Cl.
| G11C 7/10 | (2006.01) |
| G11C 11/22 | (2006.01) |
| G11C 11/4097 | (2006.01) |
| G11C 11/4094 | (2006.01) |
| G11C 11/408 | (2006.01) |
| G11C 11/4099 | (2006.01) |

(52) U.S. Cl.
CPC ...... *G11C 11/4097* (2013.01); *G11C 11/2255* (2013.01); *G11C 11/2257* (2013.01); *G11C 11/4085* (2013.01); *G11C 11/4094* (2013.01); *G11C 7/1051* (2013.01); *G11C 11/4099* (2013.01)

(58) Field of Classification Search
CPC ................................. G11C 7/06; G11C 7/1051
USPC .......................................... 365/189.011, 208
See application file for complete search history.

(56) References Cited

U.S. PATENT DOCUMENTS

| 6,141,289 | A | * | 10/2000 | Amer ....................... G11C 5/06 365/156 |
| 2002/0002696 | A1 | | 1/2002 | Park |
| 2005/0094457 | A1 | | 5/2005 | Chen et al. |
| 2008/0049486 | A1 | | 2/2008 | Gruening-Von Schwerin |
| 2011/0051485 | A1 | * | 3/2011 | Chang .................... G11C 15/00 365/49.17 |
| 2014/0016390 | A1 | | 1/2014 | Zhao et al. |
| 2014/0204656 | A1 | | 7/2014 | Kumar |

OTHER PUBLICATIONS

Bong, Kyeongryeol, et al., "A 0.62mW Ultra-Low-Power Convolutional-Neural-Network Face-Recognition Processor and a CIS Integrated with Always-On Haar-Like Face Detector," Presentation at the International Solid-State Circuits Conference, 14.6, Feb. 7, 2017, IEEE, 32 pages.

* cited by examiner

Primary Examiner — Son L Mai
(74) Attorney, Agent, or Firm — W&T/Qualcomm

(57) ABSTRACT

Transpose non-volatile (NV) memory (NVM) bit cells and related data arrays configured for both memory row and column, transpose access operations. A plurality of transpose NVM bit cells can be arranged in memory rows and columns in a transpose NVM data array. To facilitate a row read operation, the transpose NVM bit cell includes a first access transistor coupled to a word line. An activation voltage is applied to the word line to activate the first access transistor to read a memory state stored in the NVM cell circuit in a row read operation. To facilitate a column, transpose read operation, the transpose NVM bit cell includes a second access transistor coupled to a transpose word line. An activation voltage is applied to the transpose word line to activate the second access transistor to read the memory state stored in the NVM cell circuit in a column, transpose read operation.

30 Claims, 16 Drawing Sheets

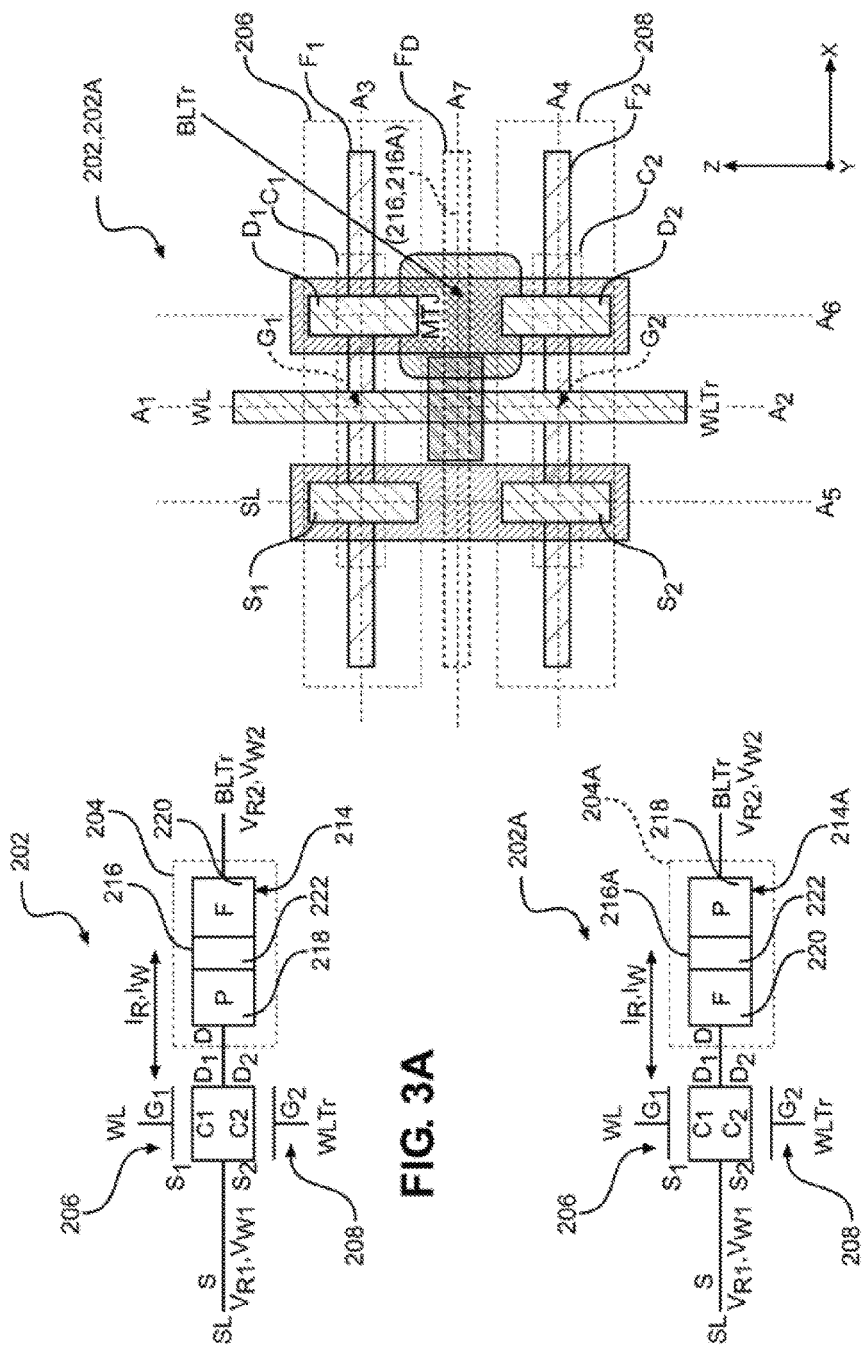

TRANSPOSE NON-VOLATILE (NV) MEMORY (NVM) BIT CELLS AND RELATED DATA ARRAYS CONFIGURED FOR ROW AND COLUMN, TRANSPOSE ACCESS OPERATIONS

BACKGROUND

I. Field of the Disclosure

The technology of the disclosure relates generally to non-volatile (NV) memory (NVM), and particularly to configuring NVM bit cells for particular read operations.

II. Background

Processor-based computer systems include memory for data storage. Different types of memory exist, each possessing certain unique features. For example, non-volatile (NV) memory (NVM) is a type of memory that can be employed in processor-based computer systems. Examples of NVM include magnetic tunnel junction (MTJ) random access memory (RAM) (MRAM), resistive RAM (RRAM), flash memory, and ferroelectric RAM (FeRAM). NVM can store information even when power is turned off. An NVM contains a plurality of NVM bit cells organized in rows and columns in an NVM data array. For any given row in an NVM data array, each column of the NVM data array includes an NVM bit cell in which a single data value or bit is stored. Read and write operations are performed on a particular NVM bit cell using read and write word lines which correspond to the NVM bit cell row that includes the particular NVM bit cell.

Data stored in an NVM data array can be used for a multitude of operations. For example, artificial intelligence (AI) applications may store data in an NVM data array corresponding to certain rows and columns in the form of a matrix, as matrices are conducive dot product to AI calculations. In particular, AI calculations conventionally involve matrix multiplication, such as performing one or more rounds of mathematical convolution to filter an image for facial recognition applications. As an example, when performing AI calculations using data stored in an NVM data array, the data may be read out of the NVM data array and stored in a dynamic RAM (DRAM), which may then be read out and stored in a static RAM (SRAM) for processing. For example, FIG. 1A illustrates an exemplary SRAM data array 100 that has pixel data stored in the SRAM data array 100. The pixel data corresponds to an image 102 on which a separable filter convolution can be performed by completing conventional row-based read operations. In particular, to perform convolution for the image 102, a selected portion 104 of the image 102 is multiplied by a d×d convolution matrix 106. In this example, the portion 104 of the image 102 is a matrix formed from selected pixels of the image 102. However, the computations associated with the convolution in FIG. 1A are time- and power-intensive.

In this regard, instead of performing the convolution in FIG. 1A (i.e., multiplying the portion 104 by the d×d convolution matrix 106), a similar result can be achieved by performing a simpler convolution approximation illustrated in FIG. 1B. For example, FIG. 1B illustrates the SRAM data array 100 on which a separable filter convolution approximation is performed by completing conventional row-based read operations to save power and processing time. In particular, instead of multiplying the portion 104 by the d×d convolution matrix 106 in FIG. 1A, the convolution approximation includes multiplying the portion 104 by a d×1 convolution matrix 108, and multiplying the product of the first multiplication by a 1×d convolution matrix 110. Performing the convolution approximation illustrated in FIG. 1B generates a substantially similar result compared to the convolution in FIG. 1A, but can be completed in less time and with less power consumption.

However, the convolution approximation of FIG. 1B involves performing calculations on corresponding columns of the SRAM data array 100 for the d×1 convolution matrix 108 computation. Unfortunately, while conventional read operations can efficiently read the SRAM data array 100 on a row basis (i.e., horizontal reading), the SRAM data array 100 cannot be efficiently read on a column basis (i.e., vertical reading). In particular, to read a column of the SRAM data array 100, each corresponding row of the SRAM data array 100 must be read using separate read operations, wherein multiple read operations are power and time intensive. Further, latency is involved in loading the image 102 from NVM into the SRAM data array 100.

SUMMARY OF THE DISCLOSURE

Aspects disclosed in the detailed description include transpose non-volatile (NV) memory (NVM) bit cells and related data arrays configured for row and column, transpose access operations. Related methods are also disclosed. In one aspect, a transpose NVM bit cell includes an NVM cell circuit that is configured to store a memory state (e.g., a voltage, charge, magnetization state). A plurality of transpose NVM bit cells can be included in an NVM data array arranged in memory rows and columns to support read and write operations. It may be desired to facilitate both a row access operation and a column access operation as a transpose access operation in a data array. In this regard, to facilitate a row read operation of a transpose NVM bit cell when included in a transpose NVM data array, the transpose NVM bit cell includes a first access transistor that includes a first gate node coupled to a word line, a first source node coupled to a source line, and a first drain node coupled to the NVM cell circuit. The NVM cell circuit is coupled to a transpose bit line. An activation voltage is applied to the word line to activate the first access transistor to allow the memory state stored in the NVM cell circuit to be applied to be read in a memory row read operation. However, to facilitate a column, transpose read operation to the same transpose NVM bit cell, the transpose NVM bit cell also includes a second access transistor that includes a second gate node coupled to a transpose word line, a second source node coupled to the first access transistor, and a second drain node coupled to the NVM cell circuit. An activation voltage is applied to the transpose word line to activate the second access transistor to allow the memory state stored in the NVM cell circuit to be applied to be read as a memory column read operation.

In this manner, separate word lines and transpose word lines facilitate both memory row and column, transpose read operations of the transpose NVM bit cells. Row and column sense amplifiers can be included in a transpose NVM data array that includes the transpose NVM bit cells to sense the memory state of a selected memory row and memory column of transpose NVM bit cells. For example, a read operation and transpose read operation can be performed in only two read cycles. The data stored in the transpose NVM bit cells is not required to be reformatted to facilitate a transpose read operation. The transpose NVM bit cells also facilitate memory row write and column, transpose write operations. For example, both access transistors of a selected memory row or column of transpose NVM bit cells in a transpose NVM data array may be activated for a write operation to increase drive current, with a write voltage applied to the source line and transpose bit lines of the selected memory row or column. A reduced voltage may be applied to the source line and transpose bit lines of the memory row or column of transpose NVM bit cells not selected for the write operation to avoid the memory state of those non-selected transpose NVM bit cells being changed. This is because in some aspects disclosed herein, all transpose word lines in the transpose NVM data array will have an activation voltage applied for a memory row write operation, thereby activating the second access transistor of the non-selected transpose NVM bit cells, or all word lines will have an activation voltage applied for a memory column write operation, thereby activating the first access transistor of the non-selected transpose NVM bit cells.

In this regard in one aspect, a transpose NVM bit cell is provided that comprises an NVM cell circuit, a first access transistor, and a second access transistor. The NVM cell circuit is coupled to a transpose bit line, and is configured to store a memory state. The first access transistor comprises a first gate node coupled to a word line, a first source node coupled to a source line, a first drain node coupled to the NVM cell circuit, and a first semiconductor channel between the first source node and the first drain node. The second access transistor comprises a second gate node coupled to a transpose word line, a second source node coupled to the first access transistor, a second drain node coupled to the NVM cell circuit, and a second semiconductor channel between the second source node and the second drain node.

In another aspect, a transpose NVM bit cell is provided. The transpose NVM bit cell comprises a means for storing a memory state in an NV state, which is coupled to a transpose bit line. The transpose NVM bit cell also comprises a first means for controlling coupling of a first voltage on a source line and a second voltage on the transpose bit line across the means for story the memory state to cause a read current to flow through the means for storing the memory state in the NV state. The transpose NVM bit cell further comprises a second means for controlling coupling of a third voltage on the source line and a fourth voltage on the transpose bit line across the means for storing the memory state to cause a transpose read current to flow through the means for storing the memory state in the NV state.

In another aspect, a transpose NVM data array is provided. The transpose NVM data array comprises a plurality of transpose NVM bit cells organized into a plurality of memory rows and a plurality of memory columns. Each transpose NVM bit cell of the plurality of transpose NVM bit cells corresponds to a memory row and a memory column. Each transpose NVM bit cell comprises an NVM cell circuit coupled to a transpose bit line, and is configured to store a memory state. Each transpose NVM bit cell also comprises a first access transistor, and a second access transistor. The first access transistor comprises a first gate node coupled to a word line, a first source node coupled to a source line, a first drain node coupled to the NVM cell circuit, and a first semiconductor channel between the first source node and the first drain node. The second access transistor comprises a second gate node coupled to a transpose word line, a second source node coupled to the first access transistor, a second drain node coupled to the NVM cell circuit, and a second semiconductor channel between the second source node and the second drain node. The transpose NVM data array further comprises a plurality of word lines, a plurality of transpose word lines, a plurality of transpose bit lines, a plurality of source lines, a plurality of column sense amplifiers, and a plurality of row sense amplifiers. Each of the plurality of word lines is coupled to the first gate nodes of the first access transistors in a respective memory row of transpose NVM bit cells among the plurality of transpose NVM bit cells. Each of the plurality of transpose word lines is coupled to the second gate nodes of the second access transistors in a respective memory column of transpose NVM bit cells among the plurality of transpose NVM bit cells. Each of the plurality of transpose bit lines is coupled to transpose NVM bit cells in a respective memory row of transpose NVM bit cells among the plurality of transpose NVM bit cells. Each of the plurality of source lines is coupled to transpose NVM bit cells in a respective memory column of transpose NVM bit cells among the plurality of transpose NVM bit cells. Each of the plurality of column sense amplifiers is electrically coupled to the source lines of transpose NVM bit cells in a respective memory column of transpose NVM bit cells among the plurality of transpose NVM bit cells, and is configured to sense a memory state of an activated transpose NVM bit cell in a respective memory column of transpose NVM bit cells in response to a first access voltage applied to the first gate node of the activated transpose NVM bit cell. Each of the plurality of row sense amplifiers is electrically coupled to a transpose bit line among the plurality of transpose bit lines of the transpose NVM bit cells among the plurality of transpose NVM bit cells, and is configured to sense a memory state of an activated transpose NVM bit cell in a respective memory row of transpose NVM bit cells in response to a second access voltage applied to the second gate node of the activated transpose NVM bit cell.

In another aspect, a method of performing a read operation and a transpose read operation on a transpose NVM bit cell is provided. The method comprises, in a memory row read operation, applying a first access voltage to a plurality of word lines each coupled to a first gate node of a transpose NVM bit cell in a memory row of NVM bit cells among a plurality of NVM bit cells. The plurality of NVM bit cells is organized into a plurality of memory rows and a plurality of memory columns. Each transpose NVM bit cell comprises an NVM cell circuit, a first access transistor, and a second access transistor. The NVM cell circuit is coupled to a transpose bit line, and is configured to store a memory state. The first access transistor comprises the first gate node coupled to a word line, a first source node coupled to a source line, a first drain node coupled to the NVM cell circuit, and a first semiconductor channel between the first source node and the first drain node. The second access transistor comprises a second gate node coupled to a transpose word line, a second source node coupled to the first access transistor, a second drain node coupled to the NVM cell circuit, and a second semiconductor channel between the second source node and the second drain node. The method further comprises applying a first read voltage to a plurality of source lines, and applying a second read voltage to the transpose bit line among a plurality of transpose bit lines in the memory row different from the first read voltage to provide a read voltage differential across the transpose NVM bit cells in the memory column.

BRIEF DESCRIPTION OF THE FIGURES

FIG. 3A is a circuit diagram of an exemplary transpose NVM bit cell that can be included in the transpose NVM data array in FIG. 2, wherein the transpose NVM bit cell is configured to be read in both a row read operation and a column, transpose read operation, wherein the NVM bit cell is a magneto-resistive random access memory (MRAM) bit cell that includes a magnetic tunnel junction (MTJ) configured in a bottom pin arrangement;

FIG. 3B is a circuit diagram of an exemplary transpose NVM bit cell configured to be read in both a row read operation and a column, transpose read operation, wherein the NVM bit cell is an MRAM bit cell that includes an MTJ configured in a top pin arrangement;

FIG. 3C is a layout diagram illustrating an exemplary top-view layout of the transpose NVM bit cell in FIG. 3A or 3B;

DETAILED DESCRIPTION

Figure 1A:
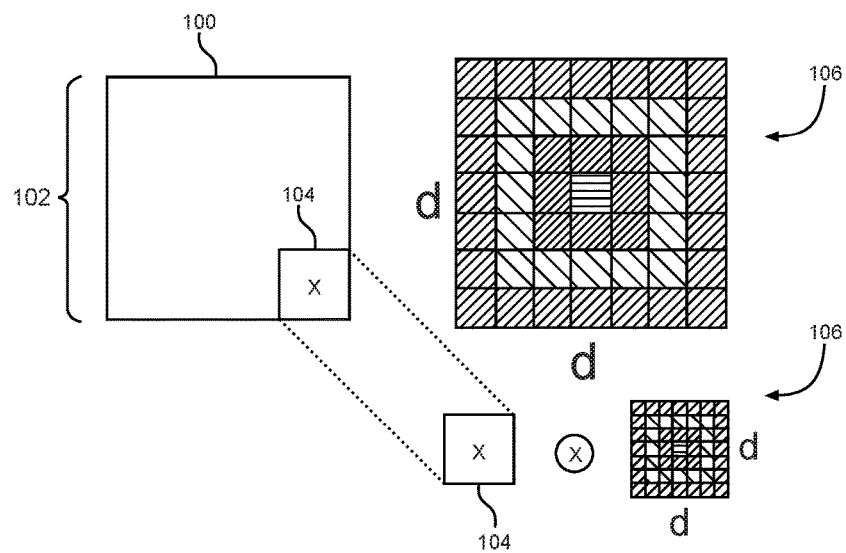
FIG. 1A is a block diagram illustrating an exemplary conventional static random access memory (SRAM) data array on which a separable filter convolution is performed using a d×d matrix.
Figure 1B:
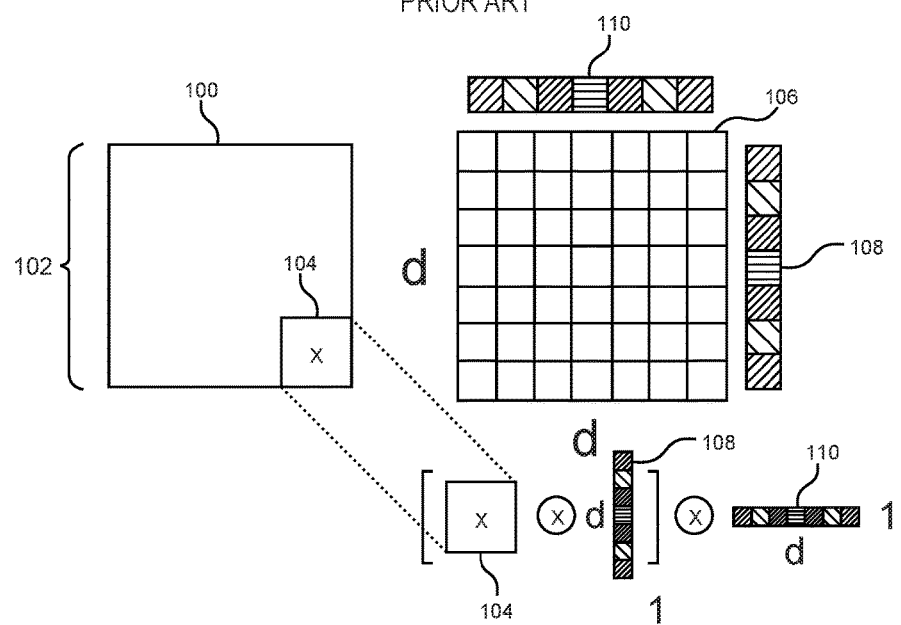
FIG. 1B is a block diagram illustrating an exemplary conventional SRAM data array on which a separable filter convolution approximation is performed by completing conventional row-based read operations.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include transpose non-volatile (NV) memory (NVM) bit cells and related data arrays configured for both row and column, transpose access operations. Related methods are also disclosed. In one aspect, a transpose NVM bit cell includes an NVM cell circuit that is configured to store a memory state (e.g., a voltage, charge, magnetization state). A plurality of transpose NVM bit cells can be included in an NVM data array arranged in memory rows and columns to support read and write operations. It may be desired to facilitate both a row access operation and a column access operation as a transpose access operation in a data array. In this regard, to facilitate a row read operation of a transpose NVM bit cell when included in a transpose NVM data array, the transpose NVM bit cell includes a first access transistor that includes a first gate node coupled to a word line, a first source node coupled to a source line, and a first drain node coupled to the NVM cell circuit. The NVM cell circuit is coupled to a transpose bit line. An activation voltage is applied to the word line to activate the first access transistor to allow the memory state stored in the NVM cell circuit to be applied to be read in a memory row read operation. However, to facilitate a column, transpose read operation to the same transpose NVM bit cell, the transpose NVM bit cell also includes a second access transistor that includes a second gate node coupled to a transpose word line, a second source node coupled to the first access transistor, and a second drain node coupled to the NVM cell circuit. An activation voltage is applied to the transpose word line to activate the second access transistor to allow the memory state stored in the NVM cell circuit to be applied to be read as a memory column read operation.

In this manner, separate word lines and transpose word lines facilitate both memory row and column, transpose read operations of the transpose NVM bit cells. Row and column sense amplifiers can be included in a transpose NVM data array that includes the transpose NVM bit cells to sense the memory state of a selected memory row and memory column of transpose NVM bit cells. For example, a read operation and transpose read operation can be performed in only two read cycles. The data stored in the transpose NVM bit cells is not required to be reformatted to facilitate a transpose read operation. The transpose NVM bit cells also facilitate memory row write and column, transpose write operations. For example, both access transistors of a selected memory row or column of transpose NVM bit cells in a transpose NVM data array may be activated for a write operation to increase drive current, with a write voltage applied to the source line and transpose bit lines of the selected memory row or column. A reduced voltage may be applied to the source line and transpose bit lines of the memory row or column of transpose NVM bit cells not selected for the write operation to avoid the memory state of those non-selected transpose NVM bit cells being changed. This is because in some aspects disclosed herein, all transpose word lines in the transpose NVM data array will have an activation voltage applied for a memory row write operation, thereby activating the second access transistor of the non-selected transpose NVM bit cells, or all word lines will have an activation voltage applied for a memory column write operation, thereby activating the first access transistor of the non-selected transpose NVM bit cells.

Figure 2:
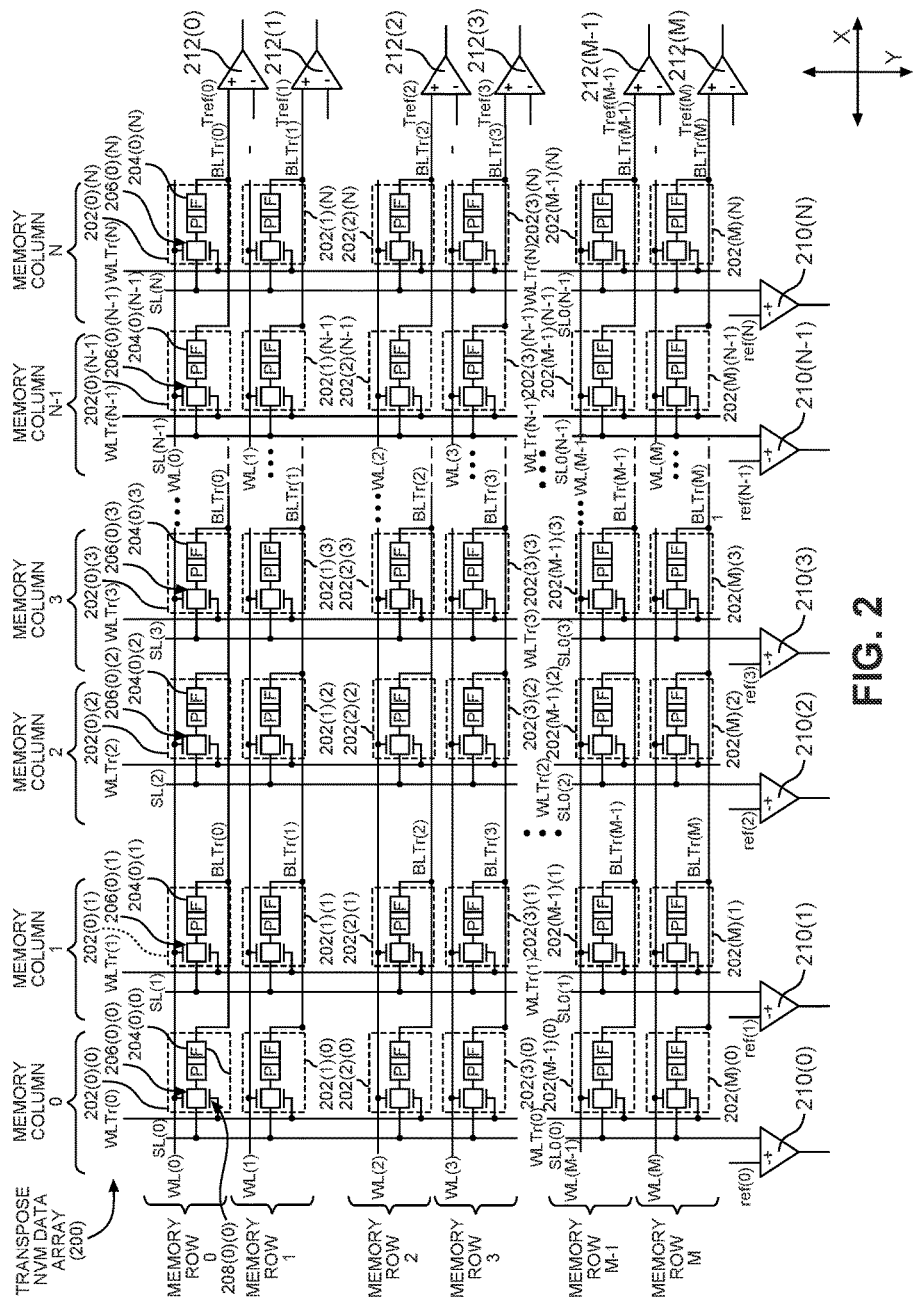
FIG. 2 is a diagram of an exemplary transpose non-volatile (NV) memory (NVM) data array comprising a plurality of transpose NVM bit cells arranged in memory rows and memory columns, wherein the transpose NVM data array is configured to support both a memory row read operation and a memory column, transpose read operation.

In this regard, FIG. 2 is a diagram of an exemplary transpose NVM data array 200 that includes a plurality of transpose NVM bit cells 202(0)(0)-202(M)(N) organized in memory rows 0-M (shown in the horizontal X direction) and memory columns 0-N (shown in the vertical Y direction). Data in a given memory state can be stored in each of the transpose NVM bit cells 202(0)(0)-202(M)(N) and retained over a power loss. In this example, a data matrix of size M+1×N+1 can be stored in the transpose NVM bit cells 202(0)(0)-202(M)(N) in the transpose NVM data array 200. For example, in this example, as will be discussed in more detail below, the transpose NVM bit cells 202(0)(0)-202(M)(N) each include transpose NVM cell circuits 204(0)(0)-204(M)(N), which in this example are magneto-resistive random access memory (MRAM) circuits that include magnetic tunnel junctions (MTJs). The transpose NVM bit cells 202(0)(0)-202(M)(N) are configured to support both memory row 0-M and memory column 0-N, transpose access operations without being required to rearrange the data stored in the transpose NVM bit cells 202(0)(0)-202(M)(N). As will be discussed in more detail below, in the example of the transpose NVM data array 200, if it is desired to read the transpose NVM bit cells of a particular memory row, say row M for example, an access voltage is applied to a word line WL(M) coupled to first access transistors 206(M)(0)-206(M)(N) of each transpose NVM bit cell 202(M)(0)-202(M)(N), corresponding to the memory row M to be read to activate the transpose NVM bit cells 202(M)(0)-202(M)(N) in the selected memory row M. A voltage is applied between a transpose bit line BLTr(M) and the source lines SL(0)-SL(N) to create a current to flow through the activated memory row M of transpose NVM cell circuits 204(M)(0)-204(M)(N). The resistance of the transpose NVM cell circuits 204(M)(0)-204(M)(N) controls the amount of current flowing through the transpose NVM cell circuits 204(M)(0)-204(M)(N) to indicate their stored memory states. Column sense amplifiers 210(0)-210(N) are provided in each memory column 0-N and coupled to the respective source lines SL(0)-SL(N) to sense the memory states of the selected memory row 0-M of transpose NVM bit cells 202(M)(0)-202(M)(N) for a memory row read operation for memory row M.

However, as will also be discussed in more detail below, in the example of the transpose NVM data array 200, if it is desired to read a particular memory column of the transpose NVM bit cells 202(0)(N)-202(M)(N), say column N for example, an access voltage is applied to a transpose word line WLTr(N) coupled to second access transistors 208(0)(N)-208(M)(N) of each transpose NVM bit cell 202(0)(N)-202(M)(N), corresponding to the memory column N to be read to activate the transpose NVM bit cells 202(0)(N)-202(M)(N) in the selected memory column N. A voltage is applied between the source line SL(N) and the transpose bit lines BLTr(0)-BLTr(M) to create a current to flow through the activated memory column 0-N of transpose NVM cell circuits 204(0)(N)-204(M)(N). The resistance of the transpose NVM cell circuits 204(0)(0)-204(M)(N) controls the amount of current flowing through the transpose NVM cell circuits 204(0)(0)-204(M)(N) to indicate their stored memory states. Row sense amplifiers 212(0)-212(M) are provided in each memory row 0-M and coupled to the respective transpose bit lines BLTr(0)-BLTr(M) to sense the memory states of the selected memory column N of transpose NVM bit cells 202(0)(N)-202(M)(N) for a memory column read operation to memory column N.

Thus, as will be discussed in more detail below, the transpose NVM bit cells 202(0)(0)-202(M)(N) in the transpose NVM data array 200 in FIG. 2 can be accessed in a memory row 0-M or memory column 0-N in a transposed fashion. The transpose NVM data array 200 can then represent either a M+1×N+1 data matrix or a transposed N+1×M+1 data matrix without having to read out and rewrite the memory states of the transpose NVM bit cells 202(0)(0)-202(M)(N). For example, if the transpose NVM data array 200 is employed in performing matrix calculations, not having to rearrange and reformat the matrix data stored in the transpose NVM bit cells 202(0)(0)-202(M)(N) can save power and processing time. This allows, for example, a memory column operation to follow a memory row operation, or vice versa, in the transpose NVM data array 200 for faster performance. For example, a convolution approximation calculation includes multiplication by a X×1 convolution matrix, and then multiplying t product of the first multiplication by a transpose 1×X convolution matrix. Thus, the ability of the transpose NVM data array 200 in FIG. 2 to allow memory row and memory column accesses without having to reformat the data stored therein may be particularly advantageous for convolution approximation calculations as an example.

FIG. 3A illustrates an example of a transpose NVM bit cell 202 that can be included in the transpose NVM bit cells 202(0)-202(M)(N) in the transpose NVM data array 200 in FIG. 2 to facilitate access as part of both a memory row operation and a memory column operation. In this regard, the transpose NVM bit cell 202 in this example includes a transpose NVM cell circuit 204 in the form of an MRAM circuit 214 that includes an MTJ 216. The MTJ 216 includes a pinned layer 218, which is a ferromagnetic material having a fixed or pinned magnetization direction (i.e., moment). The MTJ 216 also includes a free layer 220, which is a ferromagnetic material having a free magnetization direction (i.e., moment) that is allowed to be changed. A tunnel barrier 222 of a dielectric material is disposed between the pinned layer 218 and the free layer 220 to provide a tunneling barrier for electrons to tunnel there through between the pinned layer 218 and the free layer 220 as a result of a voltage differential applied across the MTJ 216. The resistance of the MTJ 216 varies with the magnetization moment of the free layer 220 and thus can represent distinct memory states. For example, the free layer 220 can be set to a parallel (P) magnetization direction with respect to the magnetization direction of the pinned layer 218 to represent one memory state, and be set to an anti-parallel (AP) magnetization direction with respect to the magnetization direction of the pinned layer 218 to represent another, different memory state. A read current $I_R$ flowing through the MTJ 216 can be sensed for a given voltage differential applied across the MTJ 216 to determine the resistance of the MTJ 216, and thus the memory state stored in the MTJ 216 as a function of the magnetization direction of the free layer 220.

With continuing reference to FIG. 3A, the transpose NVM cell circuit 204 is coupled between a transpose bit line BLTr and drain nodes $D_1$, $D_2$ of respective first and second access transistors 206, 208. The drain nodes $D_1$, $D_2$ of the first and second access transistors 206, 208 are electrically coupled together to form a common drain node D. The transpose NVM cell circuit 204 is in a bottom pin configuration in this example in that the pinned layer 218 is coupled to the drain nodes $D_1$, $D_2$ of the respective first and second access transistors 206, 208. Source nodes $S_1$, $S_2$ of the first and second access transistors 206, 208 are also electrically coupled together to form a common source node S. The source node S is coupled to a source line SL. A first gate node $G_1$ of the first access transistor 206 is coupled to a word line WL. A voltage applied to the first gate node $G_1$ controls a first semiconductor channel $C_1$ disposed between the first source node $S_1$ and the first drain node $D_1$. A second gate node $G_2$ of the second access transistor 208 is coupled to a transpose word line WLTr. A voltage applied to the second gate node $G_2$ controls a second semiconductor channel $C_2$ from the second source node $S_2$ to the second drain node $D_2$.

Thus, for a non-transpose memory read operation, such if the transpose NVM bit cell 202 in FIG. 3A were accessed as part of a memory row read operation in the transpose NVM data array 200 in FIG. 2, a first access voltage that is greater than a threshold voltage of the first access transistor 206 is applied to the word line WL to be applied to the first gate node $G_1$ to activate the first semiconductor channel $C_1$ between the first source node $S_1$ and the first drain node $D_1$. In other words, the first access transistor 206 provides a first port to the transpose NVM bit cell 202 that can be turned on to allow current to flow the transpose NVM cell circuit 204 to the source line SL. A first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the MTJ 216 of the transpose NVM cell circuit 204 to generate the read current $I_R$ as a function of the resistance of the MTJ 216 representing its memory state. The first and second read voltages $V_{R1}$, $V_{R2}$ are provided so that the read voltage differential is not high enough to change the magnetization direction of the free layer 220, which would otherwise cause a write operation. The direction of the read current $I_R$ is a function of whether the voltage differential applied from the source line SL to the transpose bit line BLTr is a positive or negative voltage. As discussed above in FIG. 2, the source line SL may be coupled to a column sense amplifier 210(0)-210(N) to sense the read current $I_R$ to then sense the memory state of the transpose NVM bit cell 202 as part of a memory row read operation. As shown in FIG. 2, the source lines SL(0)-SL(N) are coupled to each transpose NVM bit cell 202( )(0)-202( )(N) in a given respective memory column 0-N.

With continuing reference to FIG. 3A, for a transpose memory read operation, such if the transpose NVM bit cell 202 in FIG. 3A were accessed as part of a memory column read operation in the transpose NVM data array 200 in FIG. 2, a first access voltage that is greater than a threshold voltage of the second access transistor 208 is applied to the transpose word line WLTr to be applied to the second gate node $G_2$ to activate the second semiconductor channel $C_2$ between the second source node $S_2$ and the second drain node $D_2$. In other words, the second access transistor 208 provides a second port to the transpose NVM bit cell 202 that can be turned on to allow current to flow from the source line SL to the transpose NVM cell circuit 204. By providing the second access transistor 208, a voltage differential can be applied across the transpose NVM cell circuit 204 as a function of a different signal applied to the transpose word line WLTr from the word line WL. Again, a first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the MTJ 216 of the transpose NVM cell circuit 204 to generate the read current $I_R$ as a function of the resistance of the MTJ 216 representing its memory state. The first and second read voltages $V_{R1}$, $V_{R2}$ are provided so that the read voltage differential is not high enough to change the magnetization direction of the free layer 220, which would otherwise cause a write operation. The direction of the read current $I_R$ is a function of whether the voltage differential applied from the source line SL to the transpose bit line BLTr is a positive or negative voltage. As discussed above in FIG. 2, the transpose bit line BLTr may be coupled to a row sense amplifier 212(0)-212(M) to sense the read current $I_R$ to then sense the memory state of the transpose NVM bit cell 202 as part of a memory column read operation. As shown in FIG. 2, the transpose bit lines BLTr(0)-BLTr(M) are coupled to each transpose NVM bit cell 202(0)( )-202(M)(0) in a given respective memory row 0-M.

With reference back to FIG. 3A, the transpose NVM bit cell 202 also facilitates non-transpose, memory row and transpose, memory column write operations in the transpose NVM data array 200 in FIG. 2. In this regard, to perform a memory row write operation to the transpose NVM bit cell 202, a first access voltage greater than the threshold voltage of the first access transistor 206 is applied to the word line WL to be applied to the first gate node $G_1$ to activate the first semiconductor channel $C_1$ between the first source node $S_1$ and the first drain node $D_1$. A second access voltage greater than the threshold voltage of the second access transistor 208 is applied to the transpose word line WLTr to be applied to the second gate node $G_2$ to activate the second semiconductor channel $C_2$ between the second source node $S_2$ and the second drain node $D_2$. In other words, both the first and second access transistors 206, 208 are turned on in this example. A first write voltage $V_{W1}$ is applied to the source line SL for anti-parallel (AP) state writing. A second write voltage $V_{W2}$ is applied to the transpose bit line BLTr different from the first write voltage $V_{W1}$ to provide a write voltage differential between the common source line SL and the transpose bit line BLTr for parallel state (P) state writing. The first and second write voltages $V_{W1}$, $V_{W2}$ are provided so that the write voltage differential is higher than the read voltage differential for a read operation to allow the magnetization direction of the free layer 220 to be changed for a write operation. This causes a write current $I_W$ to flow through the transpose NVM cell circuit 204 to change the magnetization direction of the free layer 220. The direction of the write current $I_W$ controls whether the free layer 220 is changed to a parallel (P) or anti-parallel (AP) magnetization direction from the pinned layer 218 to represent different memory states of a logical '0' and '1'. The direction of the write current $I_W$ is controlled by the write voltages $V_{W1}$, $V_{W2}$ applied to the source line SL and transpose bit line BLTr. Note that both the first and second access transistors 206, 208 do not have to be activated to perform a write operation. However, activating both the first and second access transistors 206, 208 can increase the write current $I_W$ for performing write operations.

FIG. 3B is a circuit diagram of another exemplary transpose NVM bit cell 202A similar to the transpose NVM bit cell 202 in FIG. 3A, but with an MTJ 216A of an MRAM circuit 214A of a transpose NVM cell circuit 204A in a top pin configuration. In this configuration, the free layer 220 of the MTJ 216A is electrically coupled to the drain nodes $D_1$, $D_2$ of the first and second access transistors 206, 208. All other components that are shared between the transpose NVM bit cell 202A and the transpose NVM bit cell 202 in FIG. 3A are shown with common element numbers, and thus are not re-described. Operations of the memory read and write operations for the transpose NVM bit cell 202A in FIG. 3B are as described for the transpose NVM bit cell 202 in FIG. 3A.

FIG. 3C is a layout diagram illustrating an exemplary top-view layout of the transpose NVM bit cells 202, 202A in FIG. 3A or 3B where the first and second access transistors 206, 208 are provided as Fin Field-Effect Transistors (FinFETs). In this regard, the word line WL is disposed in a first metal gate layer and with its longitudinal axis $A_1$ disposed in a first direction (direction of Z axis), wherein the word line WL is electrically coupled to the first gate node $G_1$ of the first access transistor 206. The first gate node $G_1$ is formed by a wrap around contact of the word line WL around a first fin $F_1$ of the first access transistor 206. The first fin $F_1$ is a semiconductor material disposed along a longitudinal axis $A_3$ in the direction of the X axis and that is substantially orthogonal to the first longitudinal axis $A_1$ and forms the first semiconductor channel $C_1$ between the first source node $S_1$ and the first drain node $D_1$. The word line WL is formed as a metal gate line in a metal gate layer disposed above a substrate of a semiconductor wafer or die. The transpose word line WLTr is also disposed in the first metal gate layer and with its longitudinal axis $A_1$ disposed in the first direction and substantially parallel to the longitudinal axis $A_1$, wherein the transpose word line WLTr is electrically coupled to the second gate node $G_2$ of the second access transistor 208. The transpose word line WLTr is formed as a metal gate line in a metal gate layer disposed above a substrate of a semiconductor wafer or die. The second gate node $G_2$ is formed by a wrap around contact of the transpose word line WLTr around a second fin $F_2$ of the second access transistor 208. The second fin $F_2$ is a semiconductor material disposed along a longitudinal axis $A_4$ substantially orthogonal to the first longitudinal axis $A_1$ that forms the first semiconductor channel $C_1$ between the first source node $S_1$ and the first drain node $D_1$. The source line SL is disposed in a second metal layer and with its longitudinal axis $A_5$ substantially parallel to the longitudinal axis $A_1$, wherein the source line SL is electrically coupled to the first source node $S_1$ of the first access transistor 206 and the second source node $S_2$ of the second access transistor 208. The transpose bit line BLTr is disposed in a third metal layer and with its longitudinal axis $A_6$ substantially parallel to the first longitudinal axis $A_1$, wherein the transpose bit line BLTr is electrically coupled to the MTJ 216, 216A and connected to the first and second drain nodes $D_1$, $D_2$. The fins $F_1$, $F_2$ may be disposed on each side of a dummy fin $F_D$ disposed along a longitudinal axis $A_7$ substantially parallel to the longitudinal axes $A_3$, $A_4$ of the fins $F_1$, $F_2$.

Figure 4A:
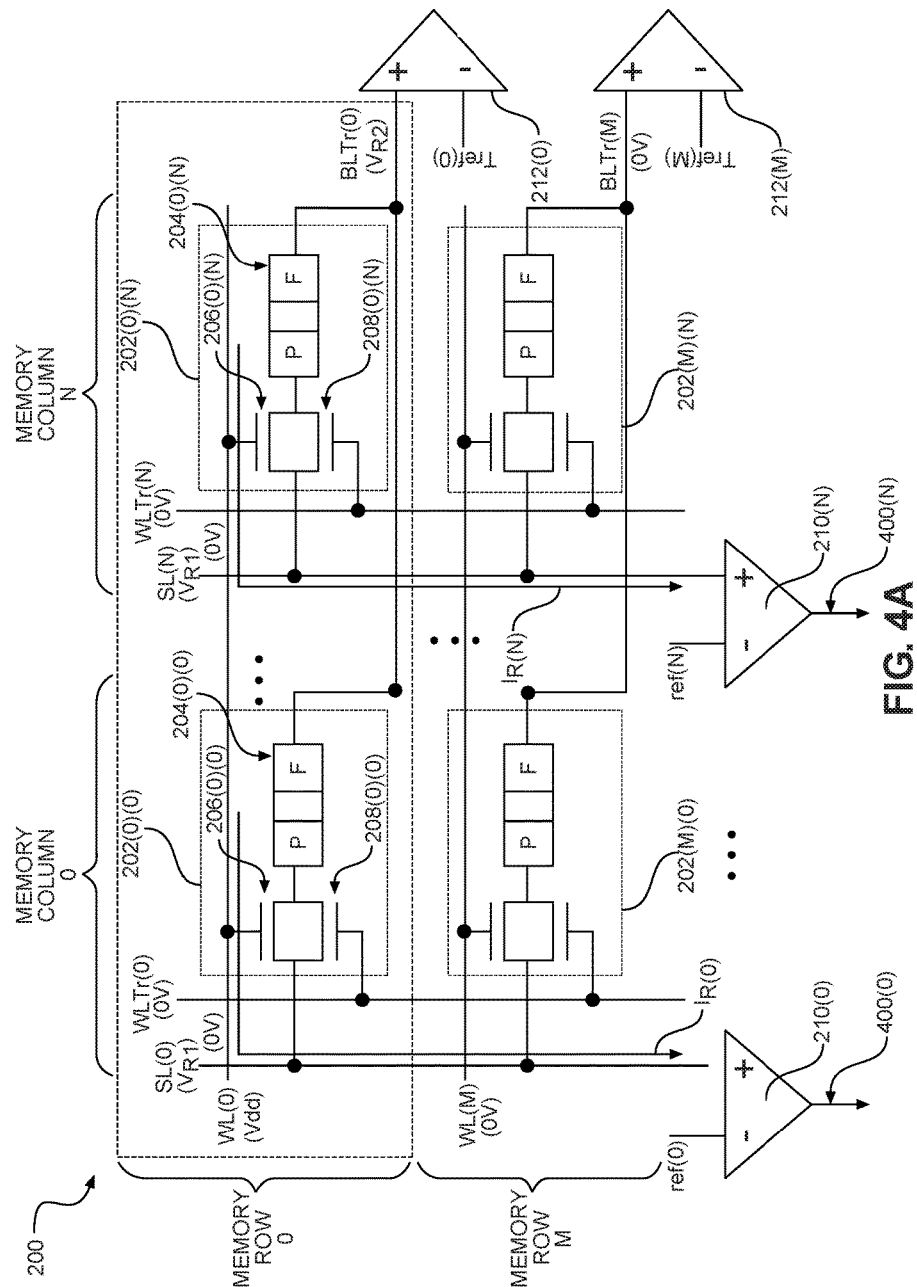
FIG. 4A illustrates an exemplary memory row read operation to a memory row of transpose NVM bit cells in the transpose NVM data array in FIG. 2.
Figure 4B:
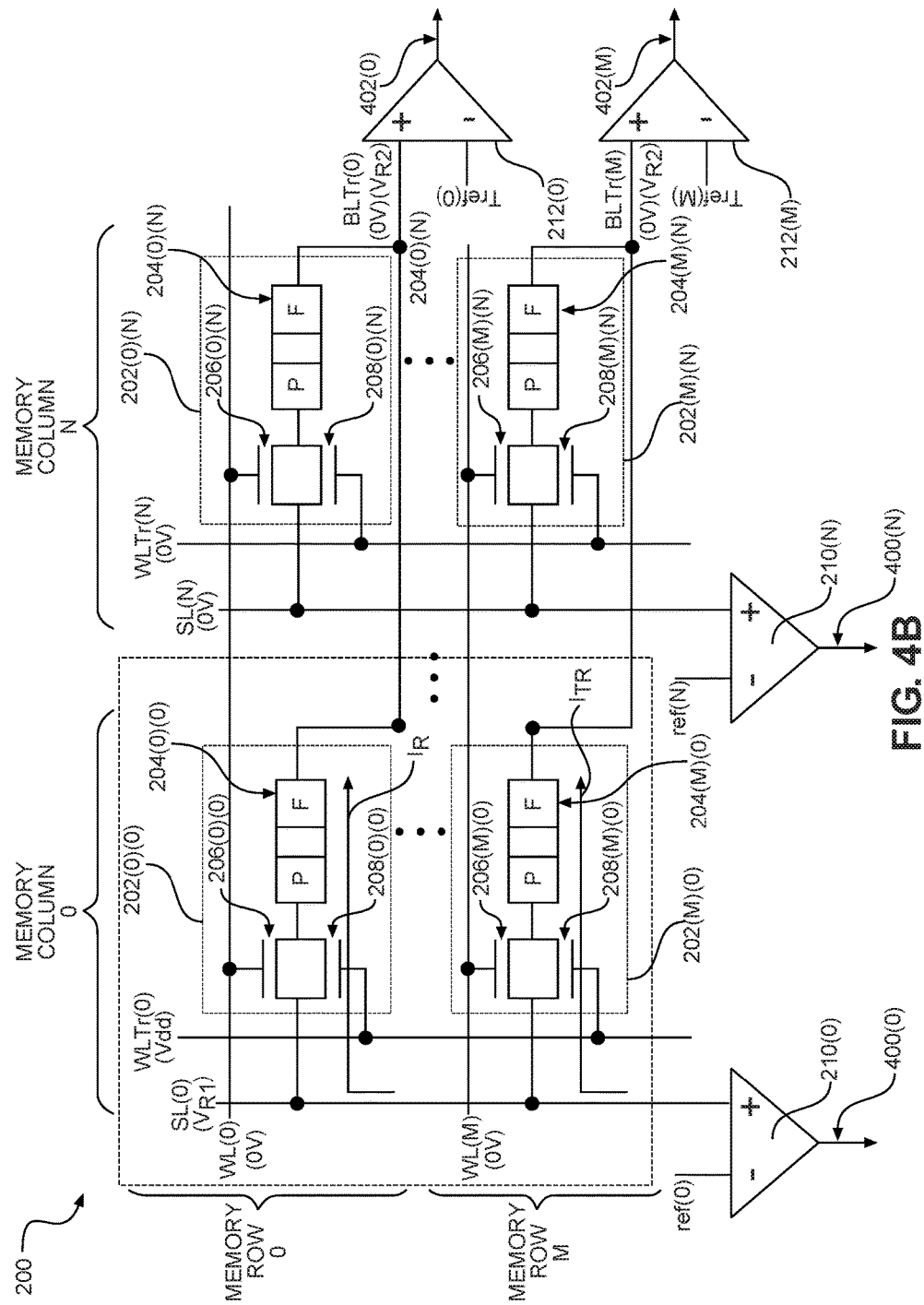
FIG. 4B illustrates an exemplary memory column, transpose read operation to a memory row of transpose NVM bit cells in the transpose NVM data array in FIG. 2.

To explain more details about how the transpose NVM bit cells 202, 202A in FIGS. 3A-3C can facilitate non-transpose and transpose memory read operations in the transpose NVM data array 200 in FIG. 2, FIGS. 4A and 4B are provided. FIG. 4A illustrates an exemplary memory row read operation to a memory row 0 of transpose NVM bit cells 202(0)(0)-202(0)(N) in the transpose NVM data array 200 in FIG. 2. FIG. 4B illustrates an exemplary memory column, transpose read operation to memory column 0 of transpose NVM bit cells 202(0)(0)-202(M)(0) in the transpose NVM data array 200 in FIG. 2. Common elements between FIGS. 4A and 4B and the transpose NVM data array 200 in FIG. 2 and the transpose NVM bit cells 202, 202A in FIGS. 3A and 3B are shown with common element numbers.

In this regard, with reference to FIG. 4A, a memory row read operation is shown being performed to the transpose NVM bit cells 202(0)(0)-202(0)(N) in memory row 0. A first access voltage Vdd is applied to the word line WL(0) to be applied to first gate nodes of the first and second access transistors 206(0)(0), 208(0)(N) of the transpose NVM bit cells 202(0)(0)-202(0)(N). A first read voltage $V_{R1}$ is applied to the source lines SL(0)-SL(N) coupled to the respective transpose NVM bit cells 202(0)(0)-202(0)(N) in memory row 0. A second read voltage $V_{R2}$ is applied to the transpose bit line BLTr(0) in memory row 0 different from the first read voltage $V_{R1}$ to provide a read voltage differential between the source lines SL(0)-SL(N) and the transpose bit line BLTr(0). In this example, the first read voltage $V_{R1}$ is 0 Volts (V) or ground, and the second read voltage $V_{R2}$ is a positive voltage higher than the first read voltage $V_{R1}$. This causes a voltage differential to be applied across the transpose NVM cell circuits 204(0)(0)-204(0)(N) in the memory row 0 to generate the read currents $I_{R(0)}$-$I_{R(N)}$ as a function of the resistance of the respective transpose NVM cell circuits 204(0)(0)-204(0)(N) representing their respective memory states. The first and second read voltages $V_{R1}$, $V_{R2}$ are provided so that the read voltage differential is not high enough to change the magnetization state of the transpose NVM cell circuits 204(0)(0)-204(0)(N). The direction of the read current $I_{R(0)}$-$I_{R(N)}$ is a function of whether the voltage differential applied from the source lines SL(0)-SL(N) to the transpose bit line BLTr(0) is a positive or negative voltage. In the example in FIG. 4A, the read current $I_{R(0)}$-$I_{R(N)}$ flows towards the column sense amplifiers 210(0)-210(N) to sense the memory states of the respective transpose NVM cell circuits 204(0)(0)-204(0)(N) in memory row 0. The read currents $I_{R(0)}$-$I_{R(N)}$ are compared to reference currents ref(0)-ref(N). For example, the reference currents ref(0)-ref(N) may be provided as mimic resistances in the middle of AP magnetization state resistance (Rap) and P magnetization state resistance (Rp) of NVM bit cells (not shown). The column sense amplifiers 210(0)-210(N) are each configured to provide outputs 400(0)-400(N) as a function of the difference between the respective read current $I_{R(0)}$-$I_{R(N)}$ flow and the reference currents ref(0)-ref(N) to indicate the memory states of the transpose NVM cell circuits 204(0)

(0)-204(0)(N) in memory row 0. Note that in this example, the word line zero voltage (0V) is applied to the word lines WL(1)-WL(M) in the memory rows 1-M as zero voltage (0V) applied to the transpose bit lines BLTr(1)-BLTr(M) so that read currents are not generated from memory rows 1-M to the column sense amplifiers 210(0)-210(N) to avoid data collisions from multiple memory rows 0-M being selected at the same time.

In this regard, with reference to FIG. 4A, a memory row read operation is shown being performed to the transpose NVM bit cells 202(0)(0)-202(0)(N) in memory row 0. A first access voltage Vdd is applied to the word line WL(0) to be applied to first gate nodes of the first access transistors 206(0)(0), 206(0)(N) of the transpose NVM bit cells 202(0)(0)-202(0)(N). The second access transistors 208(0)(0)-208(0)(N) of the transpose NVM bit cells 202(0)(0)-202(0)(N) are not activated. A first read voltage $V_{R1}$ is applied to the source lines SL(0)-SL(N) coupled to the respective transpose NVM bit cells 202(0)(0)-202(0)(N) in memory row 0. A second read voltage $V_{R2}$ is applied to the transpose bit line BLTr(0) in memory row 0 different from the first read voltage $V_{R1}$ to provide a read voltage differential between the source lines SL(0)-SL(N) and the transpose bit line BLTr(0). In this example, the first read voltage $V_{R1}$ is 0 Volts (V) or ground, and the second read voltage $V_{R2}$ is a positive voltage higher than the first read voltage $V_{R1}$. This causes a voltage differential to be applied across the transpose NVM cell circuits 204(0)(0)-204(0)(N) in the memory row 0 to generate the read currents $I_{R(0)}$-$I_{R(N)}$ as a function of the resistance of the respective transpose NVM cell circuits 204(0)(0)-204(0)(N) representing their respective memory states. The first and second read voltages $V_{R1}$, $V_{R2}$ are provided so that the read voltage differential is not high enough to change the magnetization state of the transpose NVM cell circuits 204(0)(0)-204(0)(N). The direction of the read current $I_{R(0)}$-$I_{R(N)}$ is a function of whether the voltage differential applied from the source lines SL(0)-SL(N) to the transpose bit line BLTr(0) is a positive or negative voltage. In the example in FIG. 4A, the read current $I_{R(0)}$-$I_{R(N)}$ flows towards the column sense amplifiers 210(0)-210(N) to sense the memory states of the respective transpose NVM cell circuits 204(0)(0)-204(0)(N) in memory row 0. The read currents $I_{R(0)}$-$I_{R(N)}$ are compared to reference currents ref(0)-ref(N). For example, the reference currents ref(0)-ref(N) may be provided as mimic resistances in the middle of AP magnetization state resistance (Rap) and P magnetization state resistance (Rp) of NVM bit cells (not shown). The column sense amplifiers 210(0)-210(N) are each configured to provide outputs 400(0)-400(N) as a function of the difference between the respective read current $I_{R(0)}$-$I_{R(N)}$ and the reference currents ref(0)-ref(N) to indicate the memory states of the transpose NVM cell circuits 204(0)(0)-204(0)(N) in memory row 0. Note that in this example, the same word line zero voltage (0V) is applied to the word lines WL(1)-WL(M) in the memory rows 1-M as zero voltage (0V) applied to the transpose bit lines BLTr(1)-BLTr(M) so that read currents are not generated from memory rows 1-M to the column sense amplifiers 210(0)-210(N) to avoid data collisions from multiple memory rows 0-M being selected at the same time.

In FIG. 4B, a transpose memory column read operation is shown being performed to the transpose NVM bit cells 202(0)(0)-202(M)(0) in memory column 0. A first access voltage Vdd is applied to the transpose word line WLTr(0) to be applied to second gate nodes of the second access transistors 208(0)(0), 208(M)(0) of the transpose NVM bit cells 202(0)(0)-202(M)(0). The first access transistors 206(0)(0)-206(M)(0) of the transpose NVM bit cells 202(0)(0)-202(M)(0) are not activated. A first read voltage $V_{R1}$ is applied to source line SL(0) coupled to the respective transpose NVM bit cells 202(0)(0)-202(M)(0) in memory column 0. A second read voltage $V_{R2}$ is applied to the transpose bit lines BLTr(0)-BLTr(M) in memory rows 0-M different from the first read voltage $V_{R1}$ to provide a read voltage differential between the source line SL(0) and the transpose bit lines BLTr(0)-BLTr(M). In this example, the first read voltage $V_{R1}$ is a positive voltage higher than the second read voltage $V_{R2}$ of 0 Volts (V) or ground. This causes a voltage differential to be applied across the transpose NVM cell circuits 204(0)(0)-204(M)(0) in memory column 0 to generate transpose read currents $I_{R\text{-}TR}$ as a function of the resistance of the respective transpose NVM cell circuits 204(0)(0)-204(M)(0) representing their respective memory states. The first and second read voltages $V_{R1}$, $V_{R2}$ are provided so that the read voltage differential is not high enough to change the magnetization state of the transpose NVM cell circuits 204(0)(0)-204(M)(0). The direction of the transpose read current $I_{R\text{-}TR}$ is a function of whether the voltage differential applied from the source line SL(0) to the transpose bit lines BLTr(0)-BLTr(M) is a positive or negative voltage. In the example in FIG. 4B, the transpose read currents $I_{R\text{-}TR}$ flow towards the row sense amplifiers 212(0)-212(M) to sense the memory states of the respective transpose NVM cell circuits 204(0)(0)-204(M)(0) in memory column 0. The transpose read currents $I_{R\text{-}TR}$ are compared to transpose reference currents Tref(0)-Tref(M). For example, the transpose reference currents Tref(0)-Tref(M) may be provided as mimic resistances in the middle of AP magnetization state resistance (Rap) and P magnetization state resistance (Rp) of NVM bit cells (not shown). The row sense amplifiers 212(0)-212(M) are each configured to provide outputs 402(0)-402(M) as a function of the difference between the respective transpose read currents $I_{R\text{-}TR}$ and the transpose reference currents Tref(0)-Tref(M) to indicate the memory states of the transpose NVM cell circuits 204(0)(0)-204(M)(0) in memory column 0. Note that in this example, the same zero voltage (0V) applied to the transpose word lines WLTr(1)-WLTr(N) in the memory columns 1—is also applied as a zero voltage (0V) for voltage $V_{R2}$ to the transpose bit lines BLTr(0)-BLTr(M) so that read currents are not generated from memory columns 1-N to the row sense amplifiers 212(0)-212(M) to avoid data collisions from multiple memory columns 0-N being selected at the same time.

Figure 5:
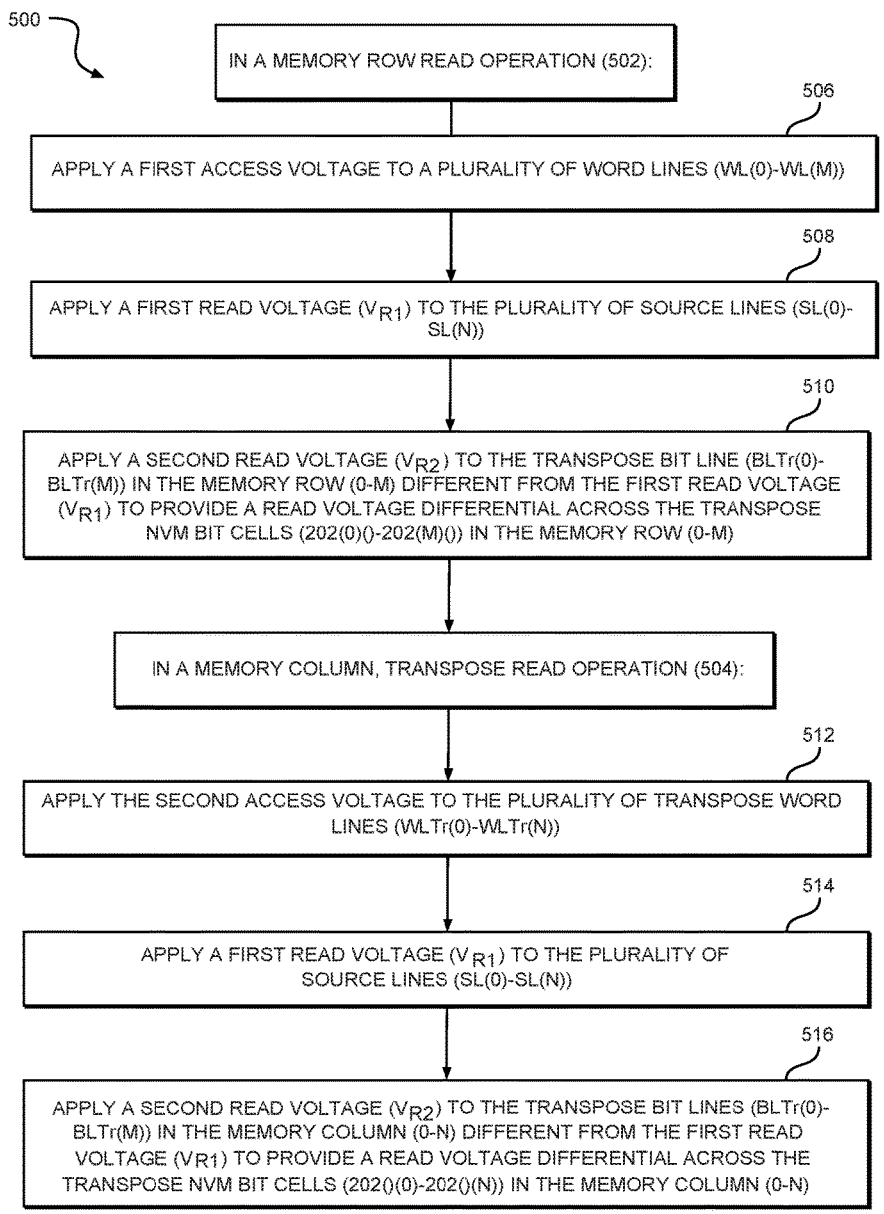
FIG. 5 is a flowchart illustrating an exemplary memory read operation process for performing a memory row read operation and a memory column, transpose read operation in the transpose NVM data array in FIG. 2.

FIG. 5 is a flowchart 500 illustrating exemplary read operation processes for performing a memory row read operation and a memory column transpose read operation in the transpose NVM data array 200 in FIG. 2, according to the examples provided in FIGS. 4A and 4B, respectively. In this regard, a memory row read operation 502 involves applying a first access voltage to a plurality of word lines WL(0)-WL(M) in the transpose NVM data array 200 (block 506). The memory row read operation 502 also involves applying a first read voltage $V_{R1}$ to the plurality of source lines SL(0)-SL(N) (block 508). The memory row read operation 502 also involves applying a second read voltage $V_{R2}$ to the transpose bit line BLTr(0)-BLTr(M) in the memory row 0-M different from the first read voltage $V_{R1}$ to provide a read voltage differential across the transpose NVM bit cells 202(0)( )-202(M)( ) in the memory row 0-M (block 510). A memory column, transpose read operation 504 involves applying the second access voltage to the plurality of transpose word lines WLTr(0)-WLTr(N) (block 512). The memory column, transpose read operation 504 also involves applying a first read voltage $V_{R1}$ to the plurality of source lines SL(0)-SL(N) (block 514). The memory column, transpose read operation 504 also involves applying a second read voltage ($V_{R2}$) to the transpose bit lines BLTr(0)-BLTr(M) in the memory column 0-N different from the first read voltage ($V_{R1}$) to provide a read voltage differential across the transpose NVM bit cells 202( )(0)-202( )(N) in the memory column 0-N (block 516).

Figure 6A:
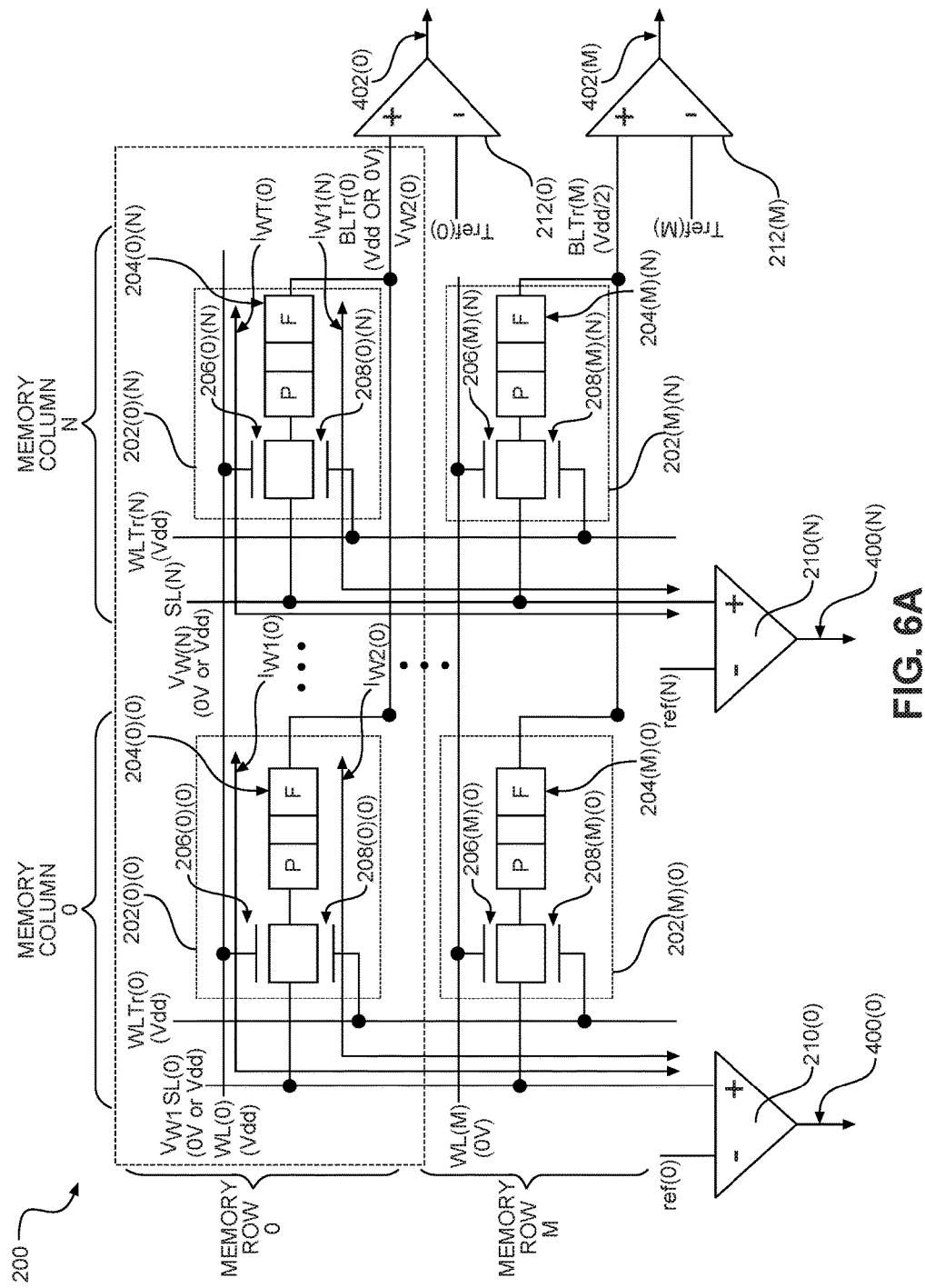
FIG. 6A illustrates an exemplary memory row write operation to a memory row of transpose NVM bit cells in the transpose NVM data array in FIG. 2.
Figure 6B:
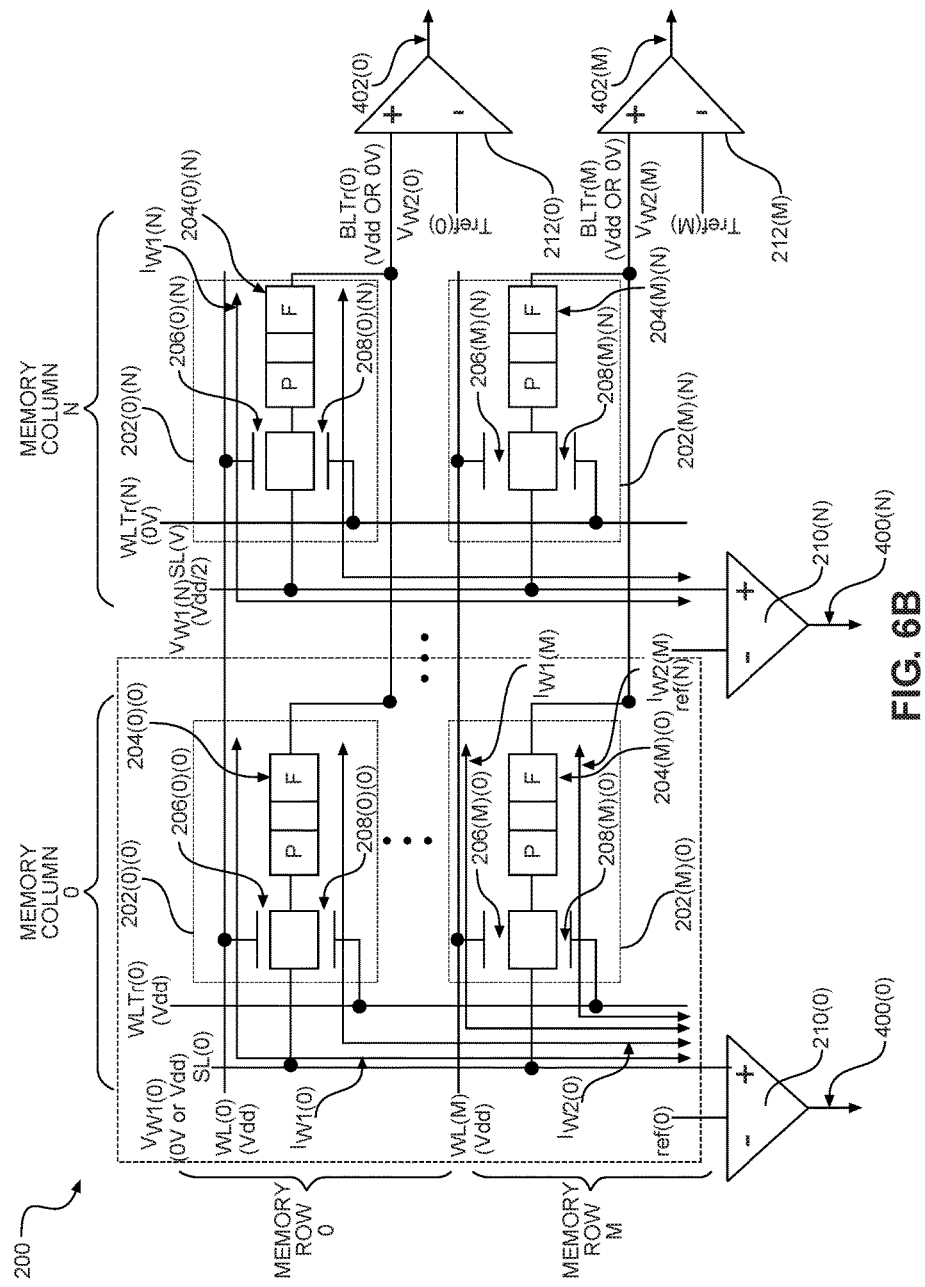
FIG. 6B illustrates an exemplary memory column, transpose write operation to a memory row of transpose NVM bit cells in the transpose NVM data array in FIG. 2.

To further illustrate memory row and column write operations in the transpose NVM data array 200 in FIG. 2, FIGS. 6A and 6B are provided. FIG. 6A illustrates an exemplary memory row write operation to a memory row 0 of transpose NVM bit cells 202(0)(0)-202(0)(N) in the transpose NVM data array 200. In this regard, to perform a memory row write operation to the transpose NVM bit cells 202(0)(0)-202(0)(N) in memory row 0, a first access voltage Vdd greater than the threshold voltage of the first access transistors 206(0)(0)-206(0)(N) is applied to the word line WL(0) to activate the first access transistors 206(0)(0)-206(0)(N). A second access voltage Vdd greater than the threshold voltage of the second access transistors 208(0)(0)-208(0)(N) is applied to the transpose word lines WLTr(0)-WLTr(N) to activate second access transistors 208(0)(0)-208(0)(N). First write voltages $V_{W1(0)}$-$V_{W1(N)}$ are applied to the respective source lines SL(0)-SL(N). A second write voltage $V_{W2(0)}$ is applied to the transpose bit line BLTr(0) different from the first write voltages $V_{W1(0)}$-$V_{W1(N)}$ to provide a write voltage differential between the source lines SL(0)-SL(N) and the transpose bit line BLTr(0). The first and second write voltages $V_{W1(0)}$-$V_{W1(N)}$, $V_{W2(0)}$ are provided so that the write voltage differential is higher than the read voltage differential for a read operation to allow the magnetization state of the transpose NVM bit cells 202(0)(0)-202(0)(N) in memory row 0 to be changed for a write operation. Note that second write voltages $V_{W2(1)}$-$V_{W2(M)}$ (e.g., ½ of voltage Vdd or less) are provided to the transpose bit lines BLTr(1)-BLTr(M) so that the currents are not strong enough to write to the transpose NVM bit cells 202(1)(0)-202(M)(N) in memory rows 1-M, because the first write voltages $V_{W1(0)}$-$V_{W1(N)}$ applied to the source lines SL(0)-SL(N) could cause current to flow in an unknown manner without controlling the second write voltages $V_{W2(1)}$-$V_{W2(M)}$ on the transpose bit lines BLTr(1)-BLTr(M). The applied first and second write voltages $V_{W1(0)}$-$V_{W1(N)}$, $V_{W2(0)}$ cause write currents $I_{W1(0)}$-$I_{W1(N)}$ to flow through transpose NVM cell circuits 204(0)(0)-204(0)(N) to change the magnetization state. The direction of the write currents $I_{W1(0)}$-$I_{W1(N)}$, $I_{W2(0)}$-$I_{W2(N)}$ controls whether the memory state is written as a logical '0' and '1'. The direction of the write currents $I_{W1(0)}$-$I_{W1(N)}$, $I_{W2(0)}$-$I_{W2(N)}$ is controlled by the first and second write voltages $V_{W1(0)}$-$V_{W1(N)}$, $V_{W2(0)}$ applied to the source lines SL(0)-SL(N) and transpose bit line BLTr(0). Note that either the first or second access transistors 206(0)(0)-206(0)(N), 208(0)(0)-208(0)(N) in memory row 0 do not have to be activated to perform a write operation. However, activating both the first and second access transistors 206(0)(0)-206(0)(N), 208(0)(0)-208(0)(N) in memory row 0 can increase the write currents $I_{W1(0)}$-$I_{W1(N)}$, $I_{W2(0)}$-$I_{W2(N)}$ for performing write operations.

FIG. 6B illustrates an exemplary memory column write operation to a memory column 0 of transpose NVM bit cells 202(0)(0)-202(M)(0) in the transpose NVM data array 200. In this regard, to perform a memory column write operation to the transpose NVM bit cells 202(0)(0)-202(M)(0) in memory column 0, a first access voltage Vdd greater than the threshold voltage of the first access transistors 206(0)(0)-206(M)(0) is applied to the word line WL(0) to activate the first access transistors 206(0)(0)-206(M)(0). A second access voltage Vdd greater than the threshold voltage of the second access transistors 208(0)(0)-208(M)(0) is applied to the transpose word line WLTr(0) to activate the second access transistors 208(0)(0)-208(M)(0). A first write voltage $V_{W1(0)}$ is applied to the source line SL(0). Second write voltages $V_{W2(0)}$-$V_{W2(M)}$ are applied to the transpose bit lines BLTr(0)-BLTr(M) different from the first write voltage $V_{W1(0)}$ to provide a write voltage differential between the source lines SL(0) and the transpose bit lines BLTr(0)-BLTr(M). The first and second write voltages $V_{W1(0)}$, $V_{W2(0)}$-$V_{W2(M)}$ are provided so that the write voltage differential is higher than the read voltage differential for a read operation to allow the magnetization state of the transpose NVM bit cells 202(0)(0)-202(M)(0) in memory column 0 to be changed for a write operation. Note that first write voltages $V_{W1(1)}$-$V_{W1(N)}$ (e.g., ½ of voltage Vdd or less) are provided to the source lines SL(1)-SL(N) so that the currents are not strong enough to write to the transpose NVM bit cells 202(0)(1)-202(M)(N) in memory columns 1-N, because the second write voltages $V_{W2(0)}$-$V_{W2(M)}$ applied to the transpose bit lines BLTr(0)-BLTr(M) could cause current to flow in an unknown manner without controlling the first write voltages $V_{W1(1)}$-$V_{W1(N)}$ on the source lines SL(1)-SL(N). The applied first and second write voltages $V_{W1(0)}$, $V_{W2(0)}$-$V_{W2(M)}$ cause write currents $I_{W1(0)}$-$I_{W1(M)}$, $I_{W2(0)}$-$I_{W2(M)}$ to flow through transpose NVM cell circuits 204(0)(0)-204(M)(0) to control their magnetization state. The direction of the write currents $I_{W1(0)}$-$I_{W1(M)}$, $I_{W2(0)}$-$I_{W2(M)}$ controls whether the memory state is written as a logical '0' or '1'. The direction of the write currents $I_{W1(0)}$-$I_{W1(M)}$ is controlled by the first and second write voltages $V_{W1(0)}$, $V_{W2(0)}$-$V_{W2(M)}$ applied to the source line SL(0) and transpose bit lines BLTr(0)-BLTr(M). Note that either the first or second access transistor 206(0)(0)-206(M)(0), 208(0)(0)-208(M)(0) in memory column 0 does not have to be activated to perform a write operation. However, activating both the first and second access transistors 206(0)(0)-206(M)(0), 208(0)(0)-208(M)(0) in memory column 0 can increase the write currents $I_{W1(0)}$-$I_{W1(M)}$, $I_{W2(0)}$-$I_{W2(M)}$ for performing write operations.

Figure 7A:
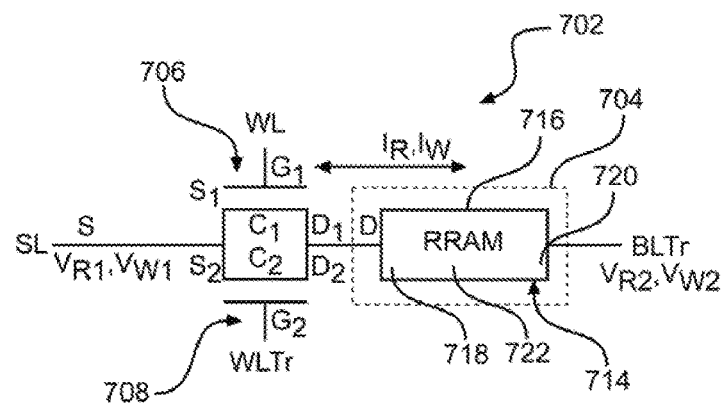
FIG. 7A is a circuit diagram of another exemplary transpose NVM bit cell comprising a transpose resistive random access memory (RRAM) bit cell that can be included in the transpose NVM data array in FIG. 2, wherein the transpose RRAM bit cell is configured to be both read in a row read operation and a column, transpose read operation.

FIG. 7A illustrates another example of a transpose NVM bit cell 702 that can be included in the transpose NVM bit cells 202(0)(0)-202(M)(N) in the transpose NVM data array 200 in FIG. 2 to facilitate access as part of both a memory row operation and a memory column operation. In this regard, the transpose NVM bit cell 702 in this example includes an NVM cell circuit 704 in the form of an MRAM circuit 714 that includes an RRAM circuit 716. The RRAM circuit 716 includes a memristor 718. The resistance of the memristor 718 can be changed across a dielectric solid-state material. A read current $I_R$ flowing through the memristor 718 can be sensed for a given voltage differential applied across the memristor 718 to determine the resistance of the RRAM circuit 716, and thus the memory state stored in the RRAM circuit 716 as a function of the resistance of the memristor 718.

With continuing reference to FIG. 7A, the NVM cell circuit 704 is coupled between a transpose bit line BLTr and drain nodes $D_1$, $D_2$ of respective first and second access transistors 706, 708. The drain nodes $D_1$, $D_2$ of the first and second access transistors 706, 708 are electrically coupled together to form a common drain node D. Source nodes $S_1$, $S_2$ of the first and second access transistors 706, 708 are also electrically coupled together to form a common source node S. The source node S is coupled to the source line SL. A first gate node $G_1$ of the first access transistor 706 is coupled to a word line WL. A voltage applied to the first gate node $G_1$ controls a first semiconductor channel $C_1$ disposed between the first source node $S_1$ and the first drain node $D_1$. A second gate node $G_2$ of the second access transistor 708 is coupled to a transpose word line WLTr. A voltage applied to the second gate node $G_2$ controls a second semiconductor channel $C_2$ from the second source node $S_2$ to the second drain node $D_2$.

Thus, for a non-transpose memory read operation, such if the transpose NVM bit cell 702 in FIG. 7A were accessed as part of a memory row read operation in the transpose NVM data array 200 in FIG. 2, a first access voltage that is greater than the threshold voltage of the first access transistor 706 is applied to the word line WL to be applied to the first gate node $G_1$ to activate the first semiconductor channel $C_1$ between the first source node $S_1$ and the first drain node $D_1$. In other words, the first access transistor 706 provides a first port to the transpose NVM bit cell 702 that can be turned on to allow current to flow from the source line SL to the NVM cell circuit 704. A first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the RRAM circuit 716 of the NVM cell circuit 704 to generate the read current $I_R$ as a function of the resistance of the RRAM circuit 716 representing its memory state. The first and second read voltages $V_{R1}$, $V_{R2}$ are provided so that the read voltage differential is not high enough to change the resistance of the memristor 718, which would otherwise cause a write operation. The direction of the read current $I_R$ is a function of whether the voltage differential applied from the source line SL to the transpose bit line BLTr is a positive or negative voltage. As discussed above in FIG. 2, the source line SL may be coupled to a column sense amplifier 210(0)-210(N) to sense the read current $I_R$ to then sense the memory state of the transpose NVM bit cell 702 as part of a memory column read operation.

With continuing reference to FIG. 7A, for a transpose memory read operation, such if the transpose NVM bit cell 702 in FIG. 7A were accessed as part of a memory column read operation in the transpose NVM data array 200 in FIG. 2, a second access voltage that is greater than the threshold voltage of the second access transistor 708 is applied to the transpose word line WLTr to be applied to the second gate node $G_2$ to activate the second semiconductor channel $C_2$ between the second source node $S_2$ and the second drain node $D_2$. In other words, the second access transistor 708 provides a second port to the transpose NVM bit cell 702 that can be turned on to allow current to flow from the source line SL to the NVM cell circuit 704. By providing the second access transistor 708, a voltage differential can be applied across the NVM cell circuit 704 as a function of a different signal applied to the transpose word line WLTr from the word line WL. Again, a first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the RRAM circuit 716 of the NVM cell circuit 704 to generate the read current $I_R$ as a function of the resistance of the memristor 718 representing its memory state. The first and second read voltages $V_{R1}$, $V_{R2}$ are provided so that the read voltage differential is not high enough to change the resistance of the memristor 718, which would otherwise cause a write operation. The direction of the read current $I_R$ is a function of whether the voltage differential applied from the source line SL to the transpose bit line BLTr is a positive or negative voltage. As discussed above in FIG. 2, the transpose bit line BLTr may be coupled to a row sense amplifier 212(0)-212(M) to sense the read current $I_R$ to then sense the memory state of the transpose NVM bit cell 702 as part of a memory column read operation. As shown in FIG. 2, the transpose bit lines BLTr(0)-BLTr(M) are coupled to each transpose NVM bit cell 202(0)( )-202(M)(0) in a given respective memory row 0-M.

With reference back to FIG. 7A, the transpose NVM bit cell 702 also facilitates non-transpose, memory row and transpose, memory column write operations in the transpose NVM data array 200 in FIG. 2. In this regard, to perform a memory row write operation to the transpose NVM bit cell 702, a first access voltage greater than the threshold voltage of the first access transistor 706 is applied to the word line WL to be applied to the first gate node $G_1$ to activate the first semiconductor channel $C_1$ between the first source node $S_1$ and the first drain node $D_1$. A second access voltage greater than the threshold voltage of the second access transistor 708 is applied to the transpose word line WLTr to be applied to the second gate node $G_2$ to activate the second semiconductor channel $C_2$ between the second source node $S_2$ and the second drain node $D_2$. In other words, both the first and second access transistors 706, 708 are turned on in this example. A first write voltage $V_{W1}$ is applied to the source line SL. A second write voltage $V_{W2}$ is applied to the transpose bit line BLTr different from the first write voltage $V_{W1}$ to provide a write voltage differential between the common source line SL and the transpose bit line BLTr. The first and second write voltages $V_{W1}$, $V_{W2}$ are provided so that the write voltage differential is higher than the read voltage differential for a read operation to allow the resistance of the memristor 718 to be changed for a write operation. This causes a write current $I_W$ to flow through the NVM cell circuit 704 to change the resistance of the memristor 718. The direction of the write current $I_W$ is controlled by the write voltages $V_{W1}$, $V_{W2}$ applied to the source line SL and transpose bit line BLTr. Note that either the first or second access transistor 706, 708 does not have to be activated to perform a write operation. However, activating both the first and second access transistors 706, 708 can increase the write current $I_W$ for performing write operations.

Figure 7B:
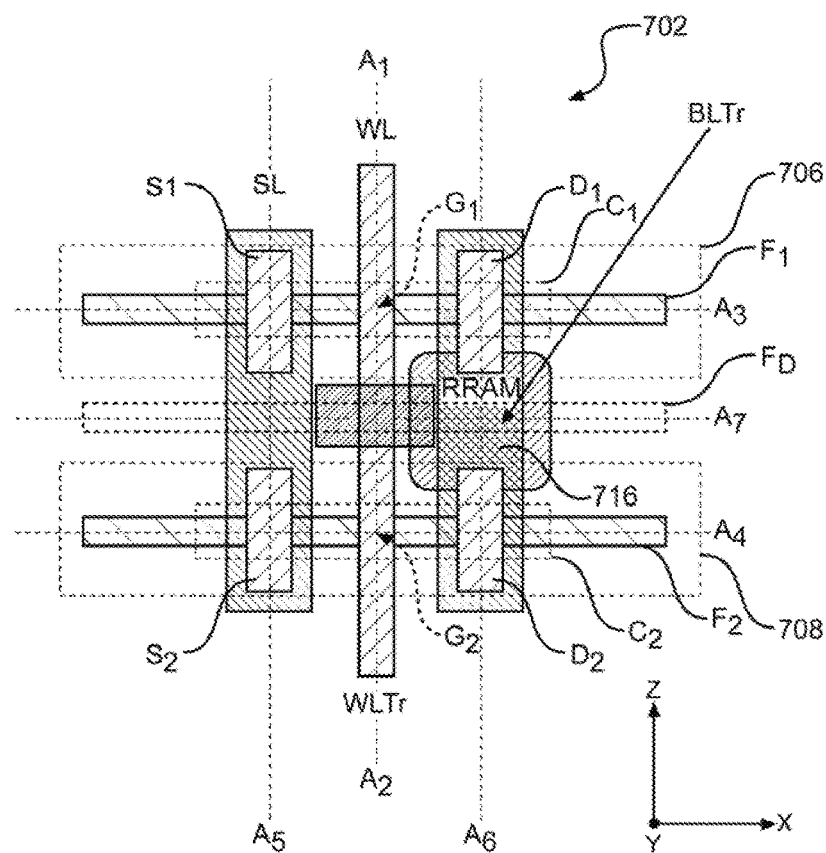
FIG. 7B is a layout diagram illustrating an exemplary layout of the transpose RRAM bit cell in FIG. 7A.

FIG. 7B is a layout diagram illustrating an exemplary top-view layout of the transpose NVM bit cell 702 in FIG. 7A where the first and second access transistors 706, 708 are provided as FinFETs. In this regard, the word line WL is disposed in a first metal gate layer and with its longitudinal axis $A_1$ disposed in a first direction (direction of Z axis), wherein the word line WL is electrically coupled to the first gate node $G_1$ of the first access transistor 706. The first gate node $G_1$ is formed by a wrap around contact of the word line WL around a first fin $F_1$ of the first access transistor 706. The first fin $F_1$ is a semiconductor material disposed along a longitudinal axis $A_3$ in the direction of the X axis and that is substantially orthogonal to the first longitudinal axis $A_1$ and forms the first semiconductor channel $C_1$ between the first source node $S_1$ and the first drain node $D_1$. The word line WL is formed as a metal gate line in a metal gate layer disposed above a substrate of a semiconductor wafer or die. The transpose word line WLTr is also disposed in the first metal gate layer and with its longitudinal axis $A_2$ disposed in the first direction and substantially parallel to the longitudinal axis $A_1$, wherein the transpose word line WLTr is electrically coupled to the second gate node $G_2$ of the second access transistor 708. The transpose word line WLTr is formed as a metal gate line in a metal gate layer disposed above a substrate of a semiconductor wafer or die. The second gate node $G_2$ is formed by a wrap around contact of the transpose word line WLTr around a second fin $F_2$ of the second access transistor 708. The second fin $F_2$ is a semiconductor material disposed along a longitudinal axis $A_4$ substantially orthogonal to the first longitudinal axis $A_1$ that forms the first semiconductor channel $C_1$ between the first source node $S_1$ and the first drain node $D_1$. The source line SL is disposed in a second metal layer and with its longitudinal axis $A_5$ substantially parallel to the longitudinal axis $A_1$, wherein the source line SL is electrically coupled to the first source node $S_1$ of the first access transistor 706 and the second source node $S_2$ of the second access transistor 708. The transpose bit line BLTr is disposed in a third metal layer and with its longitudinal axis $A_6$ substantially parallel to the first longitudinal axis $A_1$, wherein the transpose bit line BLTr is electrically coupled to the RRAM circuit 716 and connected to the first and second drain nodes $D_1$, $D_2$. The fins $F_1$, $F_2$ may be disposed on each side of a dummy fin $F_D$ disposed along a longitudinal axis $A_7$ substantially parallel to the longitudinal axes $A_3$, $A_4$ of the fins $F_1$, $F_2$.

Figure 8:
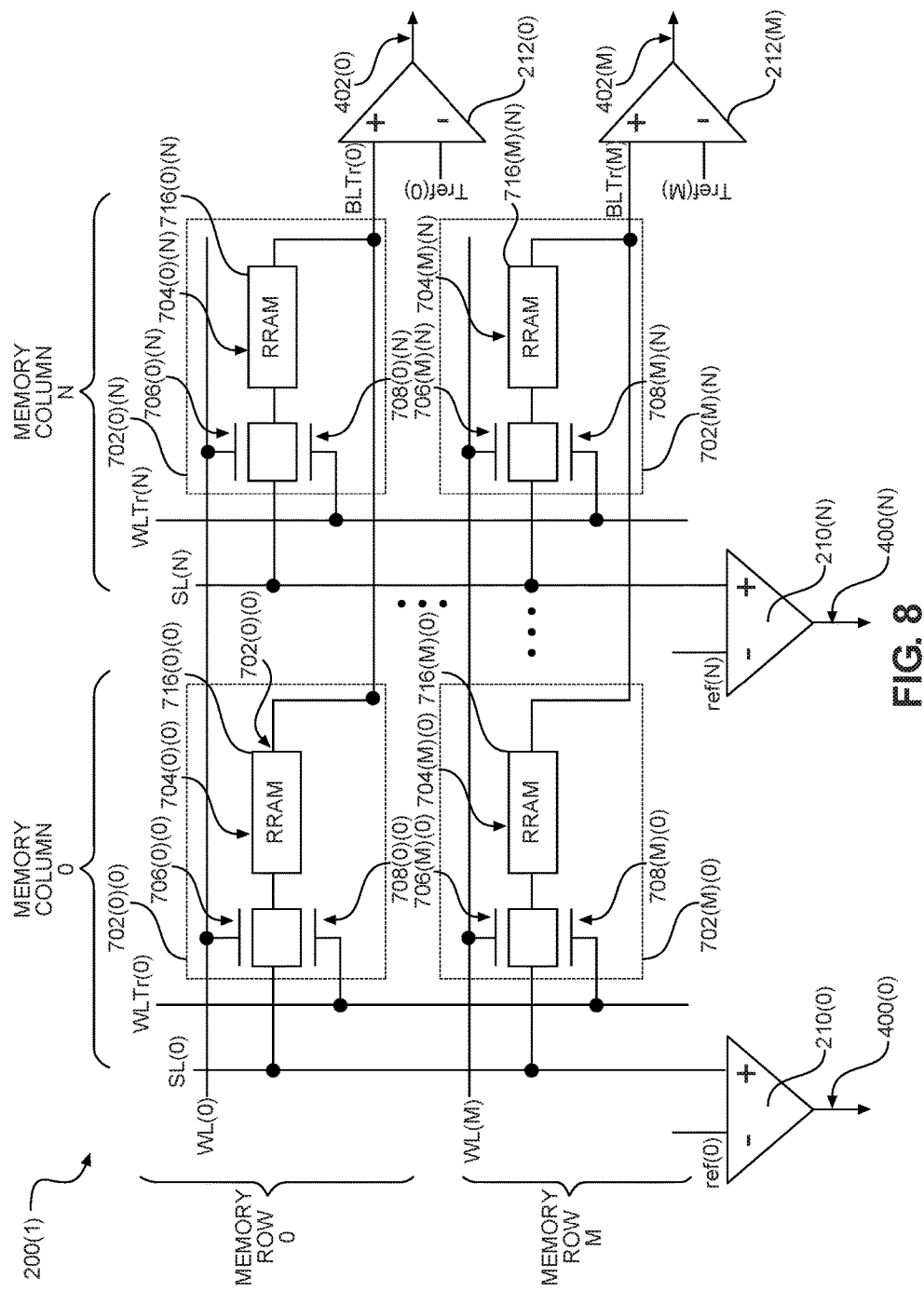
FIG. 8 is a transpose NVM data array comprising a plurality of transpose RRAM bit cells in FIG. 7A arranged in memory rows and memory columns.

FIG. 8 is a transpose NVM data array 200(1) comprising a plurality of transpose NVM bit cells 702 in FIG. 7A arranged in memory rows and memory columns. The memory row and column, transpose read operations, and memory row and column, transpose write operations can be performed as described in FIGS. 4A-4B and 6A-6B, and thus will not be repeated. Common elements between the transpose NVM data array 200(1) in FIG. 8 and the transpose NVM data array 200 in FIGS. 2, 4A-4B and 6A-6B are shown with common element numbers.

Figure 9A:
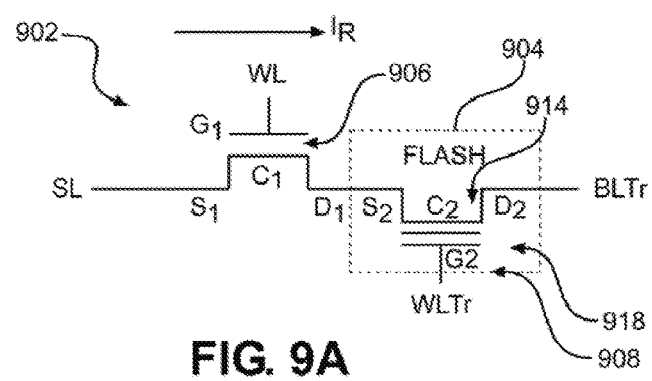
FIG. 9A is a circuit diagram of another exemplary transpose NVM bit cell comprising a transpose flash memory bit cell that can be included in the transpose NVM data array in FIG. 2, wherein the transpose flash memory bit cell is configured to both be read in a row read operation and be read in a column, transpose read operation.

FIG. 9A illustrates another example of a transpose NVM bit cell 902 that can be included in the transpose NVM bit cells 202(0)(0)-202(M)(N) in the transpose NVM data array 200 in FIG. 2 to facilitate access as part of both a memory row operation and a memory column operation. In this regard, the transpose NVM bit cell 902 in this example includes an NVM cell circuit 904 in the form of a flash memory circuit 914. The flash memory circuit 914 includes a second access transistor 908 that includes a second gate node $G_2$ comprising a control gate. The second access transistor 908 also includes a floating gate or charge trap gate 918 disposed between the second gate node $G_2$ and a second semiconductor channel $C_2$. The NVM cell circuit 904 is coupled between a transpose bit line BLTr and a first drain node $D_1$ of a first access transistor 906. The first drain node $D_1$ of the first access transistors 906 is coupled to a second source node $S_2$ of the flash memory circuit 914. The second drain node $D_2$ of the flash memory circuit 914 is coupled to the transpose bit line BLTr. The first source node $S_1$ of the first access transistors 906 is also electrically coupled to a source line SL. A first gate node $G_1$ of the first access transistor 906 is coupled to a word line WL. A voltage applied to the first gate node $G_1$ controls a first semiconductor channel $C_1$ disposed between the first source node $S_1$ and the first drain node $D_1$. The second gate node $G_2$ of the flash memory circuit 914 is coupled to a transpose word line WLTr. A voltage applied to the second gate node $G_2$ controls a second semiconductor channel $C_2$ from the second source node $S_2$ to the second drain node $D_2$.

Thus, for a non-transpose memory read operation, such if the transpose NVM bit cell 902 in FIG. 9A were accessed as part of a memory row read operation in the transpose NVM data array 200 in FIG. 2, a first access voltage that is greater than the threshold voltage of the first access transistor 906 is applied to the word line WL to be applied to the first gate node $G_1$ to activate the first semiconductor channel $C_1$ between the first source node $S_1$ and the first drain node $D_1$. In other words, the first access transistor 906 provides a first port to the transpose NVM bit cell 902 that can be turned on to allow current to flow from the source line SL to the NVM cell circuit 904. A first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the flash memory circuit 914 of the NVM cell circuit 904 to generate the read current $I_R$. The direction of the read current $I_R$ is a function of whether the voltage differential applied from the source line SL to the transpose bit line BLTr is a positive or negative voltage. As discussed above in FIG. 2, the source line SL may be coupled to a column sense amplifier 210(0)-210(N) to sense the read current $I_R$ to then sense the memory state of the transpose NVM bit cell 902 as part of a memory column read operation.

With continuing reference to FIG. 9A, for a transpose memory read operation, such if the transpose NVM bit cell 902 in FIG. 9A were accessed as part of a memory column read operation in the transpose NVM data array 200 in FIG. 2, a first access voltage that is greater than the threshold voltage of the second access transistor 908 is applied to the transpose word line WLTr to be applied to the second gate node $G_2$ to activate the second semiconductor channel $C_2$ between the second source node $S_2$ and the second drain node $D_2$. In other words, the second access transistor 908 provides a second port to the transpose NVM bit cell 902 that can be turned on to allow current to flow from the source line SL to the NVM cell circuit 904. By providing the second access transistor 908, a voltage differential can be applied across the NVM cell circuit 904 as a function of a different signal applied to the transpose word line WLTr from the word line WL. Again, a first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. The direction of the read current $I_R$ is a function of whether the voltage differential applied from the source line SL to the transpose bit line BLTr is a positive or negative voltage. As discussed above in FIG. 2, the transpose bit line BLTr may be coupled to a row sense amplifier 212(0)-212(M) to sense the read current $I_R$ to then sense the memory state of the transpose NVM bit cell 902 as part of a memory row read operation.

With reference back to FIG. 9A, the transpose NVM bit cell 902 also facilitates non-transpose, memory row and transpose, memory column write operations in the transpose NVM data array 200 in FIG. 2. In this regard, to perform a memory row write operation to the transpose NVM bit cell 902, a first access voltage greater than the threshold voltage of the first access transistor 906 is applied to the word line WL to be applied to the first gate node $G_1$ to activate the first semiconductor channel $C_1$ between the first source node $S_1$ and the first drain node $D_1$. A second access voltage greater than the threshold voltage of the second access transistor 908 is applied to the transpose word line WLTr to be applied to the second gate node $G_2$ to activate the second semiconductor channel $C_2$ between the second source node $S_2$ and the second drain node $D_2$. In other words, both the first and second access transistors 906, 908 are turned on in this example. A first write voltage $V_{W1}$ is applied to the source line SL. A second write voltage $V_{W2}$ is applied to the transpose bit line BLTr different from the first write voltage $V_{W1}$ to provide a write voltage differential between the common source line SL and the transpose bit line BLTr. The direction of the write current $I_W$ is controlled by the write voltages $V_{W1}$, $V_{W2}$ applied to the source line SL and transpose bit line BLTr. Note that both the first and second access transistors 906, 908 do not have to be activated to perform a write operation. However, activating both the first and second access transistors 906, 908 can increase the write current $I_W$ for performing write operations.

Figure 9B:
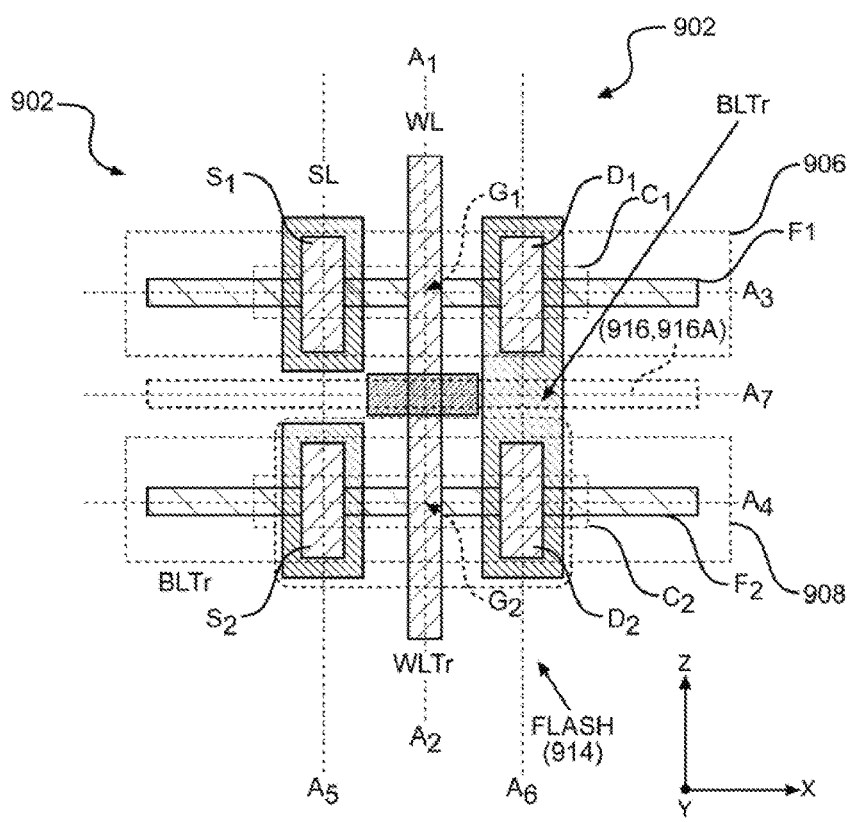
FIG. 9B is a layout diagram illustrating an exemplary layout of the transpose flash memory bit cell in FIG. 9A.

FIG. 9B is a layout diagram illustrating an exemplary top-view layout of the transpose NVM bit cell 902 in FIG. 9A where the first and second access transistors 906, 908 are provided as FinFETs. In this regard, the word line WL is disposed in a first metal gate layer and with its longitudinal axis $A_1$ disposed in a first direction (direction of Z axis), wherein the word line WL is electrically coupled to the first gate node $G_1$ of the first access transistor 906. The first gate node $G_1$ is formed by a wrap around contact of the word line WL around a first fin $F_1$ of the first access transistor 906. The first fin $F_1$ is a semiconductor material disposed along a longitudinal axis $A_3$ in the direction of the X axis and that is substantially orthogonal to the first longitudinal axis $A_1$ and forms the first semiconductor channel $C_1$ between the first source node $S_1$ and the first drain node $D_1$. The word line WL is formed as a metal gate line in a metal gate layer disposed above a substrate of a semiconductor wafer or die. The transpose word line WLTr is also disposed in the first metal gate layer and with its longitudinal axis $A_2$ disposed in the first direction and substantially parallel to the longitudinal axis $A_1$, wherein the transpose word line WLTr is electrically coupled to the second gate node $G_2$ of the second access transistor 908. The transpose word line WLTr is formed as a metal gate line in a metal gate layer disposed above a substrate of a semiconductor wafer or die. The second gate node $G_2$ is formed by a wrap around contact of the transpose word line WLTr around a second fin $F_2$ of the second access transistor 908. The second fin $F_2$ is a semiconductor material disposed along a longitudinal axis $A_4$ substantially orthogonal to the first longitudinal axis $A_1$ that forms the first semiconductor channel $C_1$ between the first source node $S_1$ and the first drain node $D_1$. The source line SL is disposed in a second metal layer and with its longitudinal axis $A_5$ substantially parallel to the longitudinal axis $A_1$, wherein the source line SL is electrically coupled to the first source node $S_1$ of the first access transistor 906 and the second source node $S_2$ of the second access transistor 208. The transpose bit line BLTr is disposed in a third metal layer and with its longitudinal axis $A_6$ substantially parallel to the first longitudinal axis $A_1$, wherein the transpose bit line BLTr is electrically coupled to the first and second drain nodes $D_1$, $D_2$. The fin $F_1$, $F_2$ may be disposed on each side of a dummy fin $F_D$ disposed along a longitudinal axis $A_7$ substantially parallel to the longitudinal axes $A_3$, $A_4$ of the fins $F_1$, $F_2$.

Figure 10:
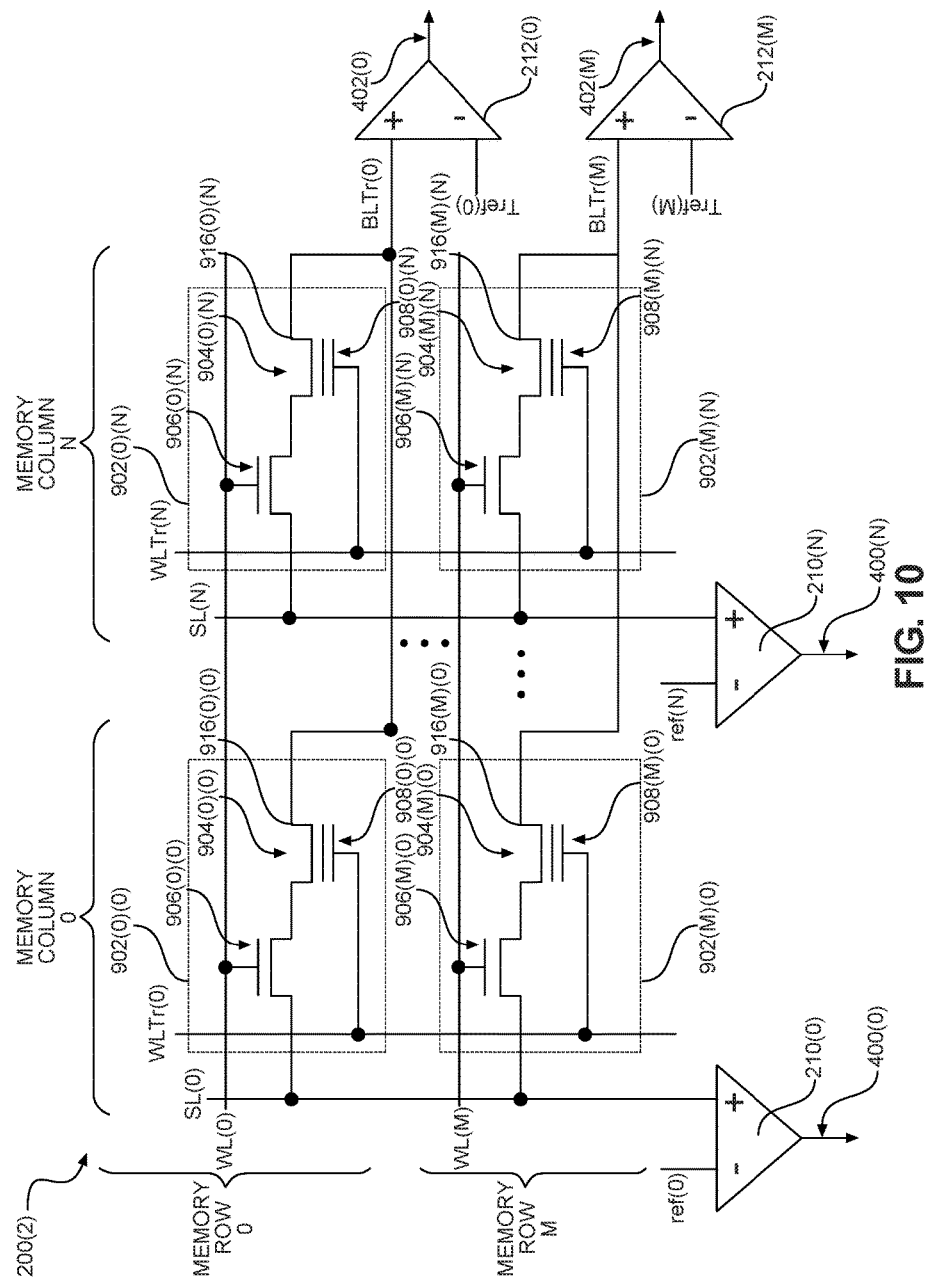
FIG. 10 is a transpose NVM data array comprising a plurality of transpose flash memory bit cells in FIG. 9A arranged in memory rows and memory columns.

FIG. 10 is a transpose NVM data array 200(2) comprising a plurality of transpose NVM bit cells 902 in FIG. 9A arranged in memory rows and memory columns. The memory row and column, transpose read operations, and memory row and column, transpose write operations can be performed as described in FIGS. 4A-4B and 6A-6B, and thus will not be repeated. Common elements between the transpose NVM data array 200(2) in FIG. 10 and the transpose NVM data array 200 in FIGS. 2, 4A-4B and 6A-6B are shown with common element numbers.

Figure 11A:
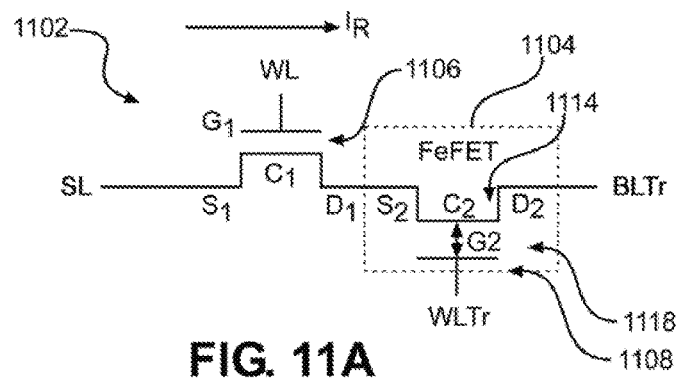
FIG. 11A is a circuit diagram of another exemplary transpose NVM bit cell comprising a transpose ferroelectric Field-Effect Transistor (FeFET) memory bit cell that can be included in the transpose NVM data array in FIG. 2, wherein the transpose FeFET memory bit cell is configured to be read in a row read operation and a column, transpose read operation.

FIG. 11A illustrates another example of a transpose NVM bit cell 1102 that can be included in the transpose NVM bit cells 202(0)(0)-202(M)(N) in the transpose NVM data array 200 in FIG. 2 to facilitate access as part of both a memory row operation and a memory column operation. In this regard, the transpose NVM bit cell 1102 in this example includes an NVM cell circuit 1104 in the form of a FeFET memory circuit 1114. The FeFET memory circuit 1114 includes a second access transistor 1108 that includes second gate node $G_2$ comprising a control gate. The second access transistor 1106 also includes a gate dielectric material 1118 comprising a ferroelectric material disposed between the second gate node $G_2$ and a second semiconductor channel $C_2$. The NVM cell circuit 1104 is coupled between a transpose bit line BLTr and a first drain node $D_1$ of a first access transistor 1106. The first drain node $D_1$ of the first access transistor 1106 is coupled to a first source node $S_1$ of the FeFET memory circuit 1114. The second drain node $D_2$ of the FeFET memory circuit 1114 is coupled to the transpose bit line BLTr. The first source node $S_1$ of the first access transistor 1106 is also electrically coupled to a source line SL. A first gate node $G_1$ of the first access transistor 1106 is coupled to a word line WL. A voltage applied to the first gate node $G_1$ controls a first semiconductor channel $C_1$ disposed between the first source node $S_1$ and the first drain node $D_1$. The second gate node $G_2$ of the FeFET memory circuit 1114 is coupled to a transpose word line WLTr. A voltage applied to the second gate node $G_2$ controls a second semiconductor channel $C_2$ from the second source node $S_2$ to the second drain node $D_2$.

Thus, for a non-transpose memory read operation, such if the transpose NVM bit cell 1102 in FIG. 11A were accessed as part of a memory row read operation in the transpose NVM data array 200 in FIG. 2, a first access voltage that is greater than the threshold voltage of the first access transistor 1106 is applied to the word line WL to be applied to the first gate node $G_1$ to activate the first semiconductor channel $C_1$ between the first source node $S_1$ and the first drain node $D_1$. In other words, the first access transistor 1106 provides a first port to the transpose NVM bit cell 1102 that can be turned on to allow current to flow from the source line SL to the NVM cell circuit 1104. A first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. This causes a voltage differential to be applied across the FeFET memory circuit 1114 of the NVM cell circuit 1104 to generate the read current $I_R$. The direction of the read current $I_R$ is a function of whether the voltage differential applied from the source line SL to the transpose bit line BLTr is a positive or negative voltage. As discussed above in FIG. 2, the source line SL may be coupled to a column sense amplifier 210(0)-210(N) to sense the read current $I_R$ to then sense the memory state of the transpose NVM bit cell 1102 as part of a memory column read operation.

With continuing reference to FIG. 11A, for a transpose memory read operation, such if the transpose NVM bit cell 1102 in FIG. 11A were accessed as part of a memory column read operation in the transpose NVM data array 200 in FIG. 2, a second access voltage that is greater than the threshold voltage of the second access transistor 1108 is applied to the transpose word line WLTr to be applied to the second gate node $G_2$ to activate the second semiconductor channel $C_2$ between the second source node $S_2$ and the second drain node $D_2$. In other words, the second access transistor 1108 provides a second port to the transpose NVM bit cell 1102 that can be turned on to allow current to flow from the source line SL to the NVM cell circuit 1104. By providing the second access transistor 1108, a voltage differential can be applied across the NVM cell circuit 1104 as a function of a different signal applied to the transpose word line WLTr from the word line WL. Again, a first read voltage $V_{R1}$ is applied to the source line SL. A second read voltage $V_{R2}$ is applied to the transpose bit line BLTr different from the first read voltage $V_{R1}$ to provide a read voltage differential between the source line SL and the transpose bit line BLTr. The direction of the read current $I_R$ is a function of whether the voltage differential applied from the source line SL to the transpose bit line BLTr is a positive or negative voltage. As discussed above in FIG. 2, the transpose bit line BLTr may be coupled to a row sense amplifier 212(0)-212(M) to sense the read current $I_R$ to then sense the memory state of the transpose NVM bit cell 1102 as part of a memory column read operation.

With reference back to FIG. 11A, the transpose NVM bit cell 1102 also facilitates non-transpose, memory row and transpose, memory column write operations in the transpose NVM data array 200 in FIG. 2. In this regard, to perform a memory row write operation to the transpose NVM bit cell 1102, a first access voltage greater than the threshold voltage of the first access transistor 1106 is applied to the word line WL to be applied to the first gate node $G_1$ to activate the first semiconductor channel $C_1$ between the first source node $S_1$ and the first drain node $D_1$. A second access voltage greater than the threshold voltage of the second access transistor 1108 is applied to the transpose word line WLTr to be applied to the second gate node $G_2$ to activate the second semiconductor channel $C_2$ between the second source node $S_2$ and the second drain node $D_2$. In other words, both the first and second access transistors 1106, 1108 are turned on in this example. A first write voltage $V_{W1}$ is applied to the source line SL. A second write voltage $V_{W2}$ is applied to the transpose bit line BLTr different from the first write voltage $V_{W1}$ to provide a write voltage differential between the common source line SL and the transpose bit line BLTr. The direction of the write current $I_W$ is controlled by the write voltages $V_{W1}$, $V_{W2}$ applied to the source line SL and transpose bit line BLTr. Note that both the first and second access transistors 1106, 1108 do not have to be activated to perform a write operation. However, activating both the first and second access transistors 1106, 1108 can increase the write current $I_W$ for performing write operations.

Figure 11B:
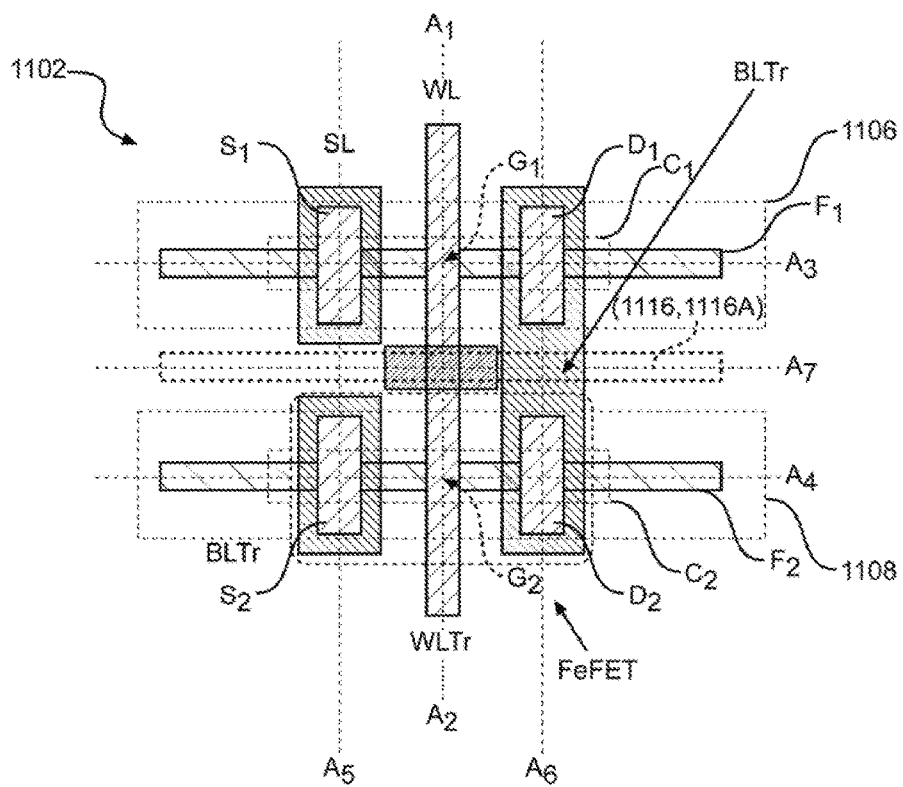
FIG. 11B is a layout diagram illustrating an exemplary layout of the transpose FeFET memory bit cell in FIG. 11A.

FIG. 11B is a layout diagram illustrating an exemplary top-view layout of the transpose NVM bit cell 1102 in FIG. 11A where the first and second access transistors 1106, 1108 are provided as FinFETs. In this regard, the word line WL is disposed in a first metal gate layer and with its longitudinal axis $A_1$ disposed in a first direction (direction of Z axis), wherein the word line WL is electrically coupled to the first gate node $G_1$ of the first access transistor 1106. The first gate node $G_1$ is formed by a wrap around contact of the word line WL around a first fin $F_1$ of the first access transistor 1106. The first fin $F_1$ is a semiconductor material disposed along a longitudinal axis $A_3$ in the direction of the X axis and that is substantially orthogonal to the first longitudinal axis $A_1$ and forms the first semiconductor channel $C_1$ between the first source node $S_1$ and the first drain node $D_1$. The word line WL is formed as a metal gate line in a metal gate layer disposed above a substrate of a semiconductor wafer or die. The transpose word line WLTr is also disposed in the first metal gate layer and with its longitudinal axis $A_2$ disposed in the first direction and substantially parallel to the longitudinal axis $A_2$, wherein the transpose word line WLTr is electrically coupled to the second gate node $G_2$ of the second access transistor 1108. The transpose word line WLTr is formed as a metal line in a metal gate layer disposed above a substrate of a semiconductor wafer or die. The second gate node $G_2$ is formed by a wrap around contact of the transpose word line WLTr around a second fin $F_2$ of the second access transistor 1108. The second fin $F_2$ is a semiconductor material disposed along a longitudinal axis $A_4$ substantially orthogonal to the first longitudinal axis $A_1$ that forms the first semiconductor channel $C_1$ between the first source node $S_1$ and the first drain node $D_1$. The source line SL is disposed in a second metal layer and with its longitudinal axis $A_5$ substantially parallel to the longitudinal axis $A_1$, wherein the source line SL is electrically coupled to the first source node $S_1$ of the first access transistor 1106 and the second source node $S_2$ of the second access transistor 1108. The transpose bit line BLTr is disposed in a third metal layer and with its longitudinal axis $A_6$ substantially parallel to the first longitudinal axis $A_1$, wherein the transpose bit line BLTr is electrically coupled to the first and second drain nodes $D_1$, $D_2$. The fins $F_1$, $F_2$ may be disposed on each side of a dummy fin $F_D$ disposed along a longitudinal axis $A_7$ substantially parallel to the longitudinal axes $A_3$, $A_4$ of the fins $F_1$, $F_2$.

Figure 12:
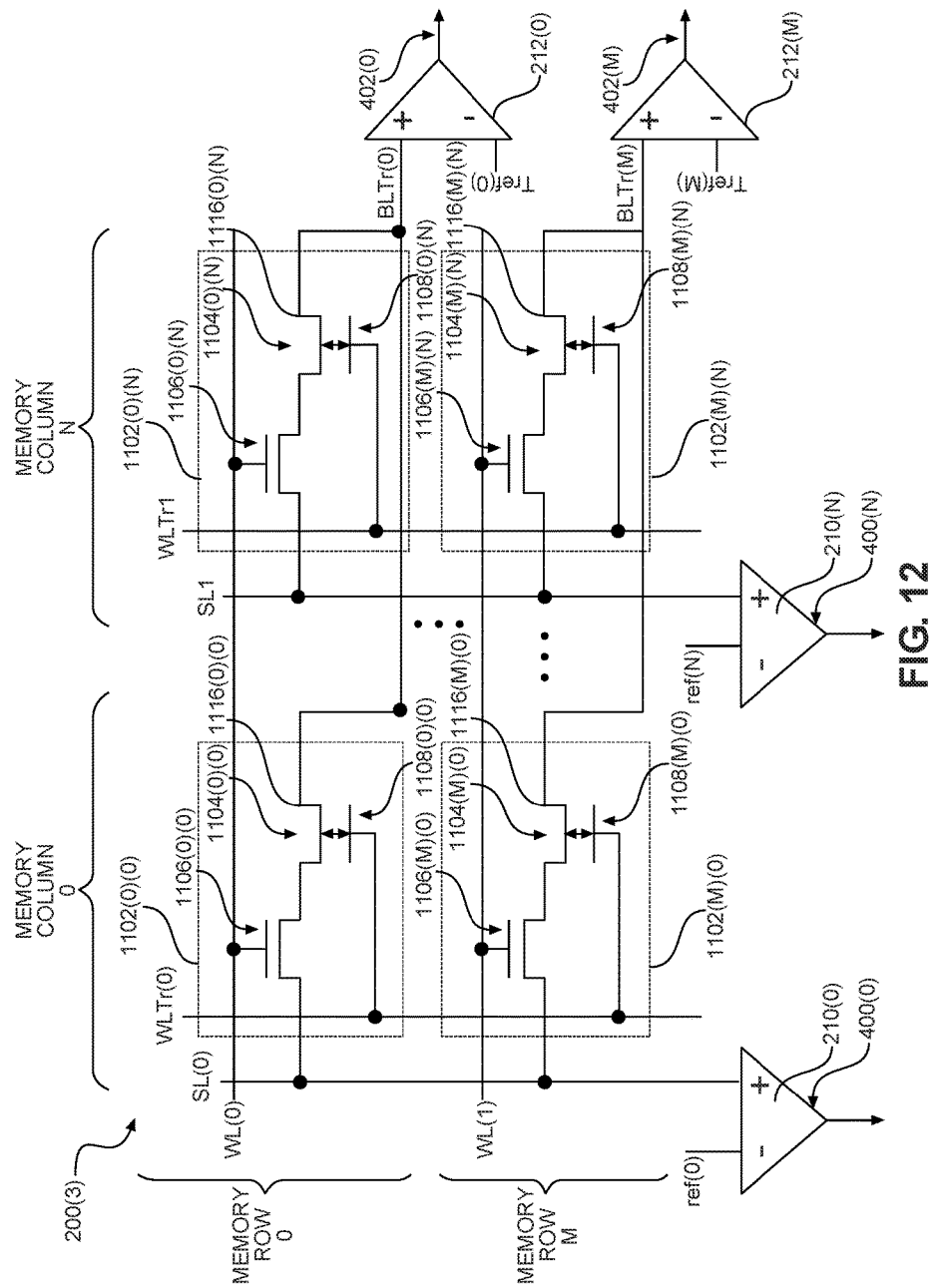
FIG. 12 is a transpose NVM data array comprising a plurality of transpose FeFET memory bit cells in FIG. 11A arranged in memory rows and memory columns.

FIG. 12 is a transpose NVM data array 200(3) comprising a plurality of transpose NVM bit cells 1102 in FIG. 11A arranged in memory rows and memory columns. The memory row and column, transpose read operations, and memory row and column, transpose write operations can be performed as described in FIGS. 4A-4B and 6A-6B, and thus will not be repeated. Common elements between the transpose NVM data array 200(3) in FIG. 12 and the transpose NVM data array 200 in FIGS. 2, 4A-4B, and 6A-6B are shown with common element numbers.

In another aspect, a transpose NVM bit cell can be provided. Examples of the transpose NVM bit cell can include the transpose NVM bit cells 202, 702, 902, and 1102 in FIGS. 2, 3A-3C, 7A-7B, 9A-9B, and 11A-11B. The transpose NVM bit cell can include a means for storing a memory state in a NV state, which can include the transpose NVM cell circuits 204, 704, 904, and 1104 in FIGS. 2, 3A-3C, 7A-7B, 9A-9B, and 11A-11B. The means for storing the memory state are coupled to a transpose bit line. The transpose NVM bit cell can also include a first means for controlling coupling of a first voltage on a source line and a second voltage on the transpose bit line across the means for storing the memory state to cause a read current to flow through the means for storing the memory state in the NV state. This can include the first access transistors 206, 706, 906, and 1106 in FIGS. 2, 3A-3C, 7A-7B, 9A-9B, and 11A-11B. The transpose NVM bit cell can also include a second means for controlling coupling of a third voltage on the source line and a fourth voltage on the transpose bit line across the means for storing the memory state to cause a transpose read current to flow through the means for storing the memory state in the NV state. This can include the second access transistors 208, 708, 908, and 1108 in FIGS. 2, 3A-3C, 7A-7B, 9A-9B, and 11A-11B.

Transpose NVM bit cells and related data arrays configured for both row and column, transpose access operations, and according to aspects disclosed herein, may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 13:
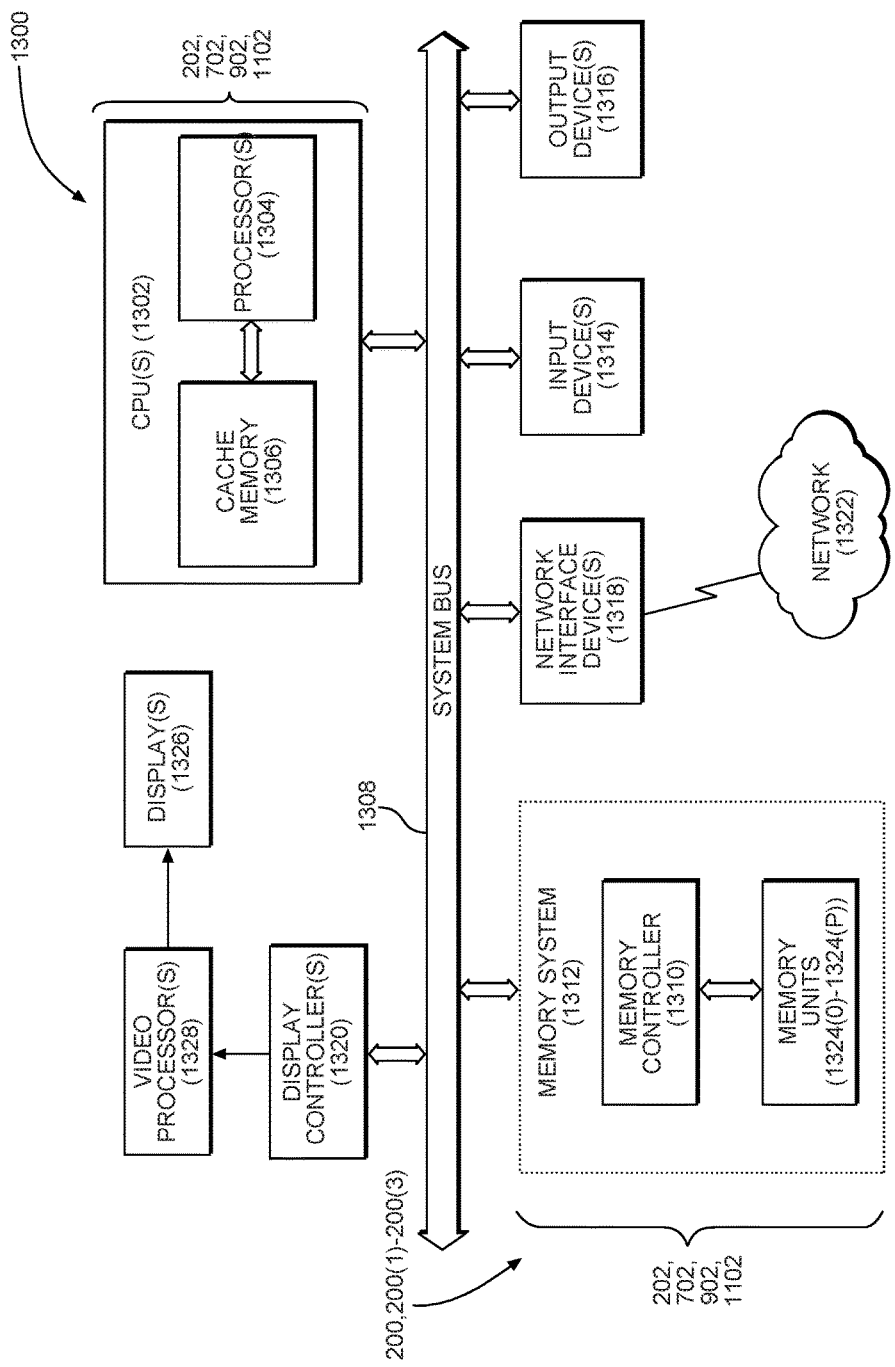
FIG. 13 is a block diagram of an exemplary processor-based system that can include transpose NVM bit cells, including the transpose NVM bit cells in FIGS. 2, 3A-3C, 7A-7B, 9A-9B, and 11A-11B and/or the transpose NVM data arrays of FIGS. 4A-4B, 6A-6B, 8, 10, and 12, to support both memory row and memory column, transpose read operations to the transpose NVM bit cells.

In this regard, FIG. 13 illustrates an example of a processor-based system 1300 that can include memory that includes transpose NVM bit cells 202, 702, 902, and 1102 in FIGS. 2, 3A-3C, 7A-7B, 9A-9B, and 11A-11B and/or the transpose NVM data arrays 200, 200(1)-200(3) of FIGS. 4A-4B, 6A-6B, 8, 10, and 12, respectively. In this example, the processor-based system 1300 includes one or more central processing units (CPUs) 1302, each including one or more processors 1304. The CPU(s) 1302 may have cache memory 1306 coupled to the processor(s) 1304 for rapid access to temporarily stored data. The CPU(s) 1302 is coupled to a system bus 1308 and can intercouple master and slave devices included in the processor-based system 1300. As is well known, the CPU(s) 1302 communicates with these other devices by exchanging address, control, and data information over the system bus 1308. For example, the CPU(s) 1302 can communicate bus transaction requests to a memory controller 1310 as an example of a slave device. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1312, one or more input devices 1314, one or more output devices 1316, one or more network interface devices 1318, and one or more display controllers 1320, as examples. The input device(s) 1314 can include any type of input device, including, but not limited to, input keys, switches, voice processors, etc. The output device(s) 1316 can include any type of output device, including, but not limited to, audio, video, other visual indicators, etc. The network interface device(s) 1318 can be any device configured to allow exchange of data to and from a network 1322. The network 1322 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1318 can be configured to support any type of communications protocol desired. The memory system 1312 can include one or more memory units 1324(0)-1324(P).

The CPU(s) 1302 may also be configured to access the display controller(s) 1320 over the system bus 1308 to control information sent to one or more displays 1326. The display controller(s) 1320 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Figure 14:
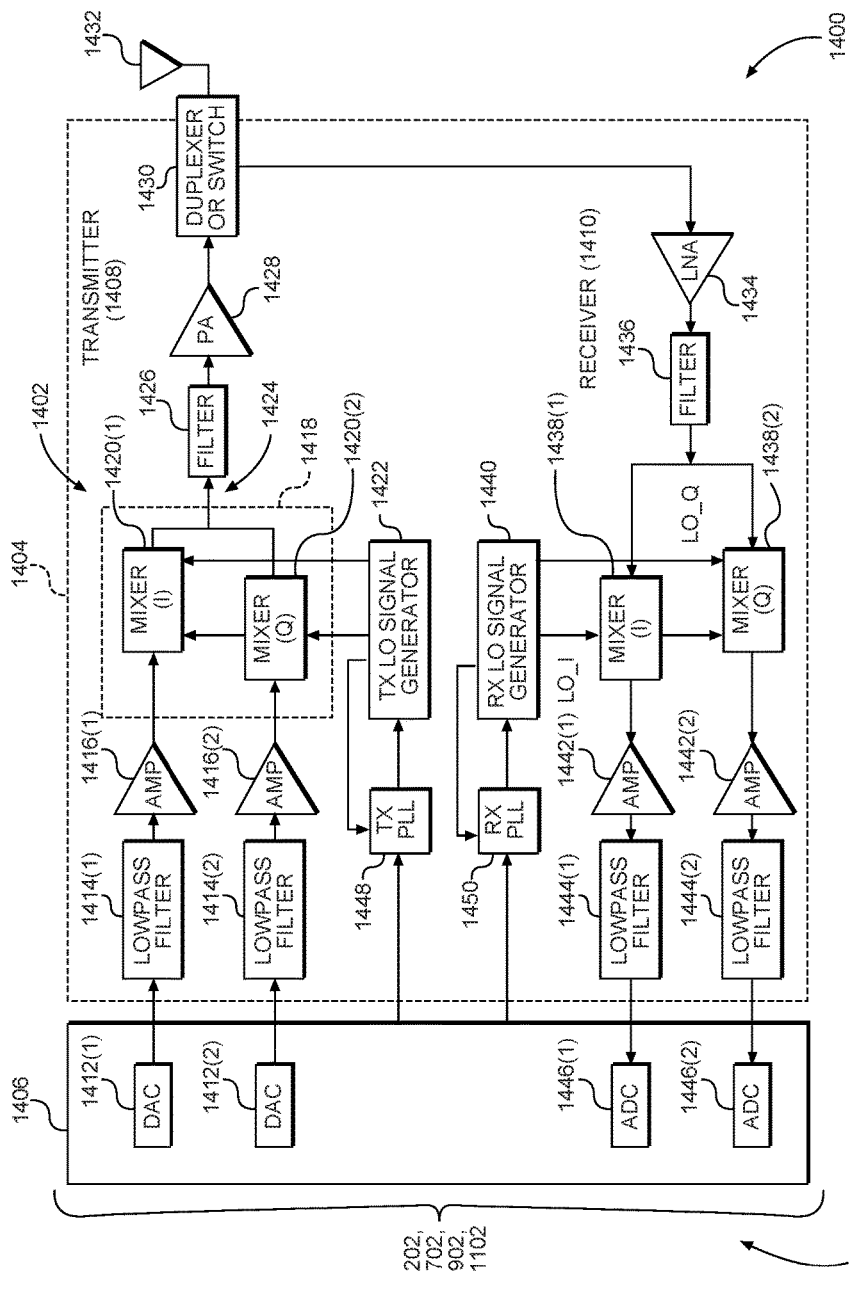
FIG. 14 is a block diagram of an exemplary wireless communications device that includes radio frequency (RF) components formed in an integrated circuit (IC), wherein the RF components can include transpose NVM bit cells, including the transpose NVM bit cells in FIGS. 2, 3A-3C, 7A-7B, 9A-9B, and 11A-11B and/or the transpose NVM data arrays of FIGS. 4A-4B, 6A-6B, 8, 10, and 12, to support both memory row and memory column, transpose read operations to the transpose NVM bit cells.

FIG. 14 illustrates an exemplary wireless communications device 1400 that includes radio frequency (RF) components formed in an integrated circuit (IC) 1402, wherein the RF components can include memory that includes transpose NVM bit cells 202, 702, 902, 1102 in FIGS. 2, 3A-3C, 7A-7B, 9A-9B, and 11A-11B and/or the transpose NVM data arrays 200, 200(1)-200(3) of FIGS. 4A-4B, 6A-6B, 8, 10, and 12, respectively. In this regard, the wireless communications device 1400 may be provided in the IC 1402. The wireless communications device 1400 may include or be provided in any of the above referenced devices, as examples. As shown in FIG. 14, the wireless communications device 1400 includes a transceiver 1404 and a data processor 1406. The data processor 1406 may include a memory to store data and program codes. The transceiver 1404 includes a transmitter 1408 and a receiver 1410 that support bi-directional communications. In general, the wireless communications device 1400 may include any number of transmitters 1408 and/or receivers 1410 for any number of communication systems and frequency bands. All or a portion of the transceiver 1404 may be implemented on one or more analog ICs, RF ICs (RFICs), mixed-signal ICs, etc.

The transmitter 1408 or the receiver 1410 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for the receiver 1410. In the direct-conversion architecture, a signal is frequency-converted between RF and baseband in one stage. The super-heterodyne and direct-conversion architectures may use different circuit blocks and/or have different requirements. In the wireless communications device 1400 in FIG. 14, the transmitter 1408 and the receiver 1410 are implemented with the direct-conversion architecture.

In the transmit path, the data processor 1406 processes data to be transmitted and provides I and Q analog output signals to the transmitter 1408. In the exemplary wireless communications device 1400, the data processor 1406 includes digital-to-analog converters (DACs) 1412(1), 1412(2) for converting digital signals generated by the data processor 1406 into the I and Q analog output signals, e.g., I and Q output currents, for further processing.

Within the transmitter 1408, lowpass filters 1414(1), 1414(2) filter the I and Q analog output signals, respectively, to remove undesired signals caused by the prior digital-to-analog conversion. Amplifiers (AMP) 1416(1), 1416(2) amplify the signals from the lowpass filters 1414(1), 1414(2), respectively, and provide I and Q baseband signals. An upconverter 1418 upconverts the I and Q baseband signals with I and Q transmit (TX) local oscillator (LO) signals through mixers 1420(1), 1420(2) from a TX LO signal generator 1422 to provide an upconverted signal 1424. A filter 1426 filters the upconverted signal 1424 to remove undesired signals caused by the frequency upconversion as well as noise in a receive frequency band. A power amplifier (PA) 1428 amplifies the upconverted signal 1424 from the filter 1426 to obtain the desired output power level and provides a transmit RF signal. The transmit RF signal is routed through a duplexer or switch 1430 and transmitted via an antenna 1432.

In the receive path, the antenna 1432 receives signals transmitted by base stations and provides a received RF signal, which is routed through the duplexer or switch 1430 and provided to a low noise amplifier (LNA) 1434. The duplexer or switch 1430 is designed to operate with a specific receive (RX)-to-TX duplexer frequency separation, such that RX signals are isolated from TX signals. The received RF signal is amplified by the LNA 1434 and filtered by a filter 1436 to obtain a desired RF input signal. Down-conversion mixers 1438(1), 1438(2) mix the output of the filter 1436 with I and Q RX LO signals (i.e., LO_I and LO_Q) from an RX LO signal generator 1440 to generate I and Q baseband signals. The I and Q baseband signals are amplified by amplifiers (AMP) 1442(1), 1442(2) and further filtered by lowpass filters 1444(1), 1444(2) to obtain I and Q analog input signals, which are provided to the data processor 1406. In this example, the data processor 1406 includes ADCs 1446(1), 1446(2) for converting the analog input signals into digital signals to be further processed by the data processor 1406.

In the wireless communications device 1400 of FIG. 14, the TX LO signal generator 1422 generates the I and Q TX LO signals used for frequency upconversion, while the RX LO signal generator 1440 generates the I and Q RX LO signals used for frequency downconversion. Each LO signal is a periodic signal with a particular fundamental frequency. A TX phase-locked loop (PLL) circuit 1448 receives timing information from the data processor 1406 and generates a control signal used to adjust the frequency and/or phase of the TX LO signals from the TX LO signal generator 1422. Similarly, an RX PLL circuit 1450 receives timing information from the data processor 1406 and generates a control signal used to adjust the frequency and/or phase of the RX LO signals from the RX LO signal generator 1440.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A transpose non-volatile (NV) memory (NVM) bit cell, comprising:
   an NVM cell circuit coupled to a transpose bit line, the NVM cell circuit configured to store a memory state;
   a first access transistor, comprising:
      a first gate node coupled to a word line;
      a first source node coupled to a source line;
      a first drain node coupled to the NVM cell circuit; and
      a first semiconductor channel between the first source node and the first drain node; and
   a second access transistor, comprising:
      a second gate node coupled to a transpose word line;
      a second source node coupled to the source line;
      a second drain node coupled to the NVM cell circuit; and
      a second semiconductor channel between the second source node and the second drain node.

2. The transpose NVM bit cell of claim 1, wherein the NVM cell circuit is configured for a read operation in response to:
   a first access voltage applied to the first gate node to activate the first semiconductor channel between the first source node and the first drain node;
   a first read voltage applied to the source line; and
   a second read voltage applied to the transpose bit line different from the first read voltage to provide a read voltage differential between the source line and the transpose bit line.

3. The transpose NVM bit cell of claim 2, wherein the NVM cell circuit is further configured for a read operation in response to:
   a second access voltage applied to the word line coupled to the second gate node to activate the second semiconductor channel between the second source node and the second drain node;
   a third read voltage applied to the source line; and
   a fourth read voltage applied to the transpose bit line different from the first read voltage to provide a read voltage differential across the NVM cell circuit.

4. The transpose NVM bit cell of claim 1, wherein the NVM cell circuit is configured for a read operation in response to:
   a second access voltage applied to the second gate node to activate the second semiconductor channel between the second source node and the second drain node;
   a first read voltage applied to the source line; and
   a second read voltage applied to the transpose bit line different from the first read voltage to provide a read voltage differential across the NVM cell circuit.

5. The transpose NVM bit cell of claim 1, wherein the NVM cell circuit is configured to store a memory state for a write operation in response to:
   a first access voltage applied to the first gate node to activate the first semiconductor channel between the first source node and the first drain node;
   a second access voltage applied to the second gate node to activate the second semiconductor channel between the second source node and the second drain node;
   a first write voltage applied to the source line; and
   a second write voltage applied to the transpose bit line different from the first write voltage to provide a write voltage differential between the source line and the transpose bit line.

6. The transpose NVM bit cell of claim 1, wherein:
   the NVM cell circuit comprises:
      a first access node; and
      a second access node coupled to the transpose bit line;
   the second drain node is coupled to the first access node of the NVM cell circuit;
   the first source node and the second source node are coupled together to form a common source node coupled to the source line; and
   the first drain node and the second drain node are coupled together to form a common drain node coupled to the first access node of the NVM cell circuit.

7. The transpose NVM bit cell of claim 6, wherein the NVM cell circuit comprises a magnetic tunnel junction (MTJ) cell circuit comprising:
   an MTJ comprising a pinned layer, a free layer, and a tunnel barrier disposed between the pinned layer and the free layer, the free layer configured to be in a parallel (P) or anti-parallel (AP) magnetization state to the pinned layer to store the memory state;
   wherein:
      the first access node is coupled to one of the pinned layer and the free layer, and the source line; and
      the second access node is coupled to one of the free layer and the pinned layer not coupled to the first electrode, and the transpose bit line.

8. The transpose NVM bit cell of claim 6, wherein the NVM cell circuit comprises a resistive random access memory (RRAM) cell circuit comprising:
   a memristor having a resistance representing the memory state, the memristor comprising:
      a first electrode comprising the first access node; and
      a second electrode comprising the second access node.

9. The transpose NVM bit cell of claim 1, wherein:
   the first drain node is coupled to the second source node; and
   the NVM cell circuit comprises the second access transistor.

10. The transpose MAI bit cell of claim 9, wherein the second access transistor comprises a flash memory cell circuit:
    wherein the second gate node comprises a control gate; and
    the second access transistor further comprising a floating gate or a trap charge gate disposed between the control gate and the second semiconductor channel.

11. The transpose NVM bit cell of claim 9, wherein the second access transistor comprises a ferroelectric Field-Effect Transistor (FeFET) cell circuit further comprising a gate dielectric material comprising ferroelectric material disposed between the second gate node and the second semiconductor channel.

12. The transpose NVM bit cell of claim 1, further comprising:
    the word line disposed in a first metal layer and having a longitudinal axis disposed in a first direction, wherein the word line is electrically coupled to the first gate node of the first access transistor;
    the transpose word line disposed in the first metal layer and having a second longitudinal axis disposed in the first direction and substantially parallel to the first longitudinal axis, wherein the transpose word line is electrically coupled to the second gate node of the second access transistor;
    the source line disposed in a second metal layer and having a third longitudinal axis substantially parallel to the first longitudinal axis, wherein the source line is electrically coupled to the first source node of the first access transistor and the second source node of the second access transistor;
    the transpose bit line disposed in a third metal layer and having a fourth longitudinal axis substantially parallel to the first longitudinal axis, wherein the transpose bit line is electrically coupled to the second drain node;
    the first access transistor further comprising a first fin comprising the first semiconductor channel, the first fin having a fifth longitudinal axis substantially orthogonal to the first longitudinal axis;
    the second access transistor further comprising a second fin comprising the second semiconductor channel, the second fin having a sixth longitudinal axis substantially orthogonal to the first longitudinal axis;
    the first gate node disposed at least partially over the first fin; and
    the second gate node disposed at least partially over the second fin.

13. The transpose NVM bit cell of claim 12, further comprising:
    a dummy fin disposed between the first fin and the second fin, the dummy fin having a seventh longitudinal axis substantially parallel to the fifth longitudinal axis.

14. The transpose NVM bit cell of claim 1 integrated into an integrated circuit (IC).

15. The transpose NVM bit cell of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

16. A transpose non-volatile (NV) memory (NVM) bit cell, comprising:
   a means for storing a memory state in an NV state, the means for storing the memory state coupled to a transpose bit line;
   a first means for controlling coupling of a first voltage on a source line and a second voltage on the transpose bit line across the means for storing the memory state to cause a read current to flow through the means for storing the memory state in the NV state; and
   a second means for controlling coupling of a third voltage on the source line and a fourth voltage on the transpose bit line across the means for storing the memory state to cause a transpose read current to flow through the means for storing the memory state in the NV state.

17. A transpose non-volatile (NV) memory (NVM) data array, comprising:
   a plurality of transpose NVM bit cells organized into a plurality of memory rows and a plurality of memory columns, wherein each transpose NVM bit cell of the plurality of transpose NVM bit cells corresponds to a memory row and a memory column, each transpose NVM bit cell comprising:
      an NVM cell circuit coupled to a transpose bit line, the NVM cell circuit configured to store a memory state;
      a first access transistor, comprising:
         a first gate node coupled to a word line;
         a first source node coupled to a source line;
         a first drain node coupled to the NVM cell circuit; and
         a first semiconductor channel between the first source node and the first drain node;
      a second access transistor, comprising:
         a second gate node coupled to a transpose word line;
         a second source node coupled to the source line;
         a second drain node coupled to the NVM cell circuit; and
         a second semiconductor channel between the second source node and the second drain node;
   a plurality of word lines each coupled to the first gate nodes of the first access transistors in a respective memory row of transpose NVM bit cells among the plurality of transpose NVM bit cells;
   a plurality of transpose word lines each coupled to the second gate nodes of the second access transistors in a respective memory column of transpose NVM bit cells among the plurality of transpose NVM bit cells;
   a plurality of transpose bit lines each coupled to transpose NVM bit cells in a respective memory row of transpose NVM bit cells among the plurality of transpose NVM bit cells;
   a plurality of source lines each coupled to transpose NVM bit cells in a respective memory column of transpose NVM bit cells among the plurality of transpose NVM bit cells;
   a plurality of column sense amplifiers each electrically coupled to the source lines of transpose NVM bit cells in a respective memory column of transpose NVM bit cells among the plurality of transpose NVM bit cells, each column sense amplifier among the plurality of column sense amplifiers configured to sense a memory state of an activated transpose NVM bit cell in a respective memory column of transpose NVM bit cells in response to a first access voltage applied to the first gate node of the activated transpose NVM bit cell; and
   a plurality of row sense amplifiers each electrically coupled to a transpose bit line among the plurality of transpose bit lines of the transpose NVM bit cells in the respective memory row of transpose NVM bit cells among the plurality of transpose NVM bit cells, each row sense amplifier among the plurality of row sense amplifiers configured to sense a memory state of an activated transpose NVM bit cell in a respective memory row of transpose NVM bit cells in response to a second access voltage applied to the second gate node of the activated transpose NVM bit cell.

18. The transpose NVM data array of claim 17, wherein the transpose NVM bit cells in a memory row of the plurality of transpose NVM bit cells are configured to be coupled to their respective plurality of source lines in response to:
   the first access voltage applied to the plurality of word lines coupled to the first gate nodes of the transpose NVM bit cells in the memory row of the plurality of transpose NVM bit cells;
   a first read voltage applied to the plurality of source lines; and
   a second read voltage applied to the transpose bit line in the memory row different from the first read voltage to provide a read voltage differential across the transpose NVM bit cells in the memory row.

19. The transpose NVM data array of claim 18, wherein the transpose NVM bit cells in a memory column of the plurality of transpose NVM bit cells are configured to be coupled to their respective memory states to the plurality of transpose bit lines in response to:
   the first access voltage applied to the plurality of transpose word lines coupled to the second gate nodes of the transpose NVM bit cells in the memory column of the plurality of transpose NVM bit cells;
   a third read voltage applied to the plurality of transpose bit lines; and
   a fourth read voltage applied to the source line in the memory column different from the first read voltage to provide a read voltage differential across the transpose NVM bit cells in the memory column.

20. The transpose NVM data array of claim 17, wherein the transpose NVM bit cells in a memory column of the plurality of transpose NVM bit cells are configured to be coupled to their respective plurality of transpose bit lines in response to:
   a second access voltage applied to the plurality of transpose word lines coupled to the second gate nodes of the transpose NVM bit cells in the memory column of the plurality of transpose NVM bit cells;
   a first read voltage applied to the source line; and
   a second read voltage applied to the plurality of transpose bit lines the memory column different from the first read voltage to provide a read voltage differential across the transpose NVM bit cells in the memory column.

21. The transpose NVM data array of claim 17, wherein the transpose NVM bit cells in a memory row of the plurality of transpose NVM bit cells are configured to store a memory state in their respective NVM cell circuits in response to:
- a first access voltage applied to the plurality of word lines coupled to the first gate nodes of the first access transistors of the transpose NVM bit cells;
- a second access voltage applied to the plurality of transpose word lines coupled to the second gate nodes of the second access transistors of the transpose NVM bit cells;
- a first write voltage applied to the plurality of source lines;
- a second write voltage applied to transpose bit line in the memory row different from the first write voltage to provide a write voltage differential across the transpose NVM bit cells in the memory row; and
- a third write voltage less than the second write voltage applied to the plurality of transpose bit lines not coupled to the transpose NVM bit cells in the memory row.

22. The transpose NVM data array of claim 21, wherein the second write voltage is at least twice a voltage of the third write voltage.

23. The transpose NVM data array of claim 17, wherein the transpose NVM bit cells in a memory column of the plurality of transpose NVM bit cells are configured to store a memory state in their respective NVM cell circuits in response to:
- a first access voltage applied to the plurality of word lines coupled to the first gate nodes of the transpose NVM bit cells;
- a second access voltage applied to the plurality of transpose word lines coupled to the second gate nodes of the transpose NVM bit cells;
- a first write voltage applied to the plurality of transpose bit lines;
- a second write voltage applied to the source line in the memory column different from the first write voltage to provide a write voltage differential across the transpose NVM bit cells in the memory row; and
- a third write voltage less than the second write voltage applied to the plurality of source lines not coupled to the transpose NVM bit cells in the memory row.

24. The transpose NVM data array of claim 23, wherein the second write voltage is at least twice a voltage of the third write voltage.

25. A method of performing a read operation and a transpose read operation on a transpose non-volatile (NV) memory (NVM) bit cell, comprising:
in a memory row read operation:
- applying a first access voltage to a plurality of word lines each coupled to a first gate node of a transpose NVM bit cell in a memory row of NVM bit cells among a plurality of NVM bit cells, the plurality of NVM bit cells organized into a plurality of memory rows and a plurality of memory columns, each transpose NVM bit cell comprising:
  - an NVM cell circuit coupled to a transpose bit line, the NVM cell circuit configured to store a memory state;
  - a first access transistor, comprising:
    - the first gate node coupled to a word line;
    - a first source node coupled to a source line;
    - a first drain node coupled to the NVM cell circuit; and
    - a first semiconductor channel between the first source node and the first drain node;
  - a second access transistor, comprising:
    - a second gate node coupled to a transpose word line;
    - a second source node coupled to the source line;
    - a second drain node coupled to the NVM cell circuit; and
    - a second semiconductor channel between the second source node and the second drain node;
- applying a first read voltage to a plurality of source lines; and
- applying a second read voltage to the transpose bit line among a plurality of transpose bit lines in the memory row different from the first read voltage to provide a read voltage differential across the transpose NVM bit cells in the memory column.

26. The method of claim 25, further comprising, in a memory column, the transpose read operation:
- applying a second access voltage to the plurality of transpose word lines each coupled to the second gate node of a transpose NVM bit cell in the memory row of NVM bit cells among the plurality of NVM bit cells;
- applying a third read voltage to the plurality of transpose bit lines; and
- applying a fourth read voltage to the source line among the plurality of source lines in the memory column different from the first read voltage to provide a read voltage differential across the transpose NVM bit cells in the memory column.

27. The method of claim 25, further comprising, in a memory row write operation:
- applying the first access voltage to the plurality of word lines;
- applying the second access voltage to a plurality of transpose word lines;
- applying a first write voltage to the plurality of source lines;
- applying a second write voltage to the transpose bit line among the plurality of transpose bit lines in the memory row different from the first write voltage to provide a write voltage differential across the transpose NVM bit cells in the memory row; and
- applying a third write voltage less than the second write voltage applied to the plurality of transpose bit lines not coupled to the transpose NVM bit cells in the memory row.

28. The method of claim 27, wherein applying the third write voltage comprises applying the third write voltage of half or less than the second write voltage of the plurality of transpose bit lines not coupled to the transpose NVM bit cells in the memory row.

29. The method of claim 25, further comprising, in a memory column, the transpose write operation:
- applying the first access voltage to the plurality of word lines;
- applying the second access voltage to a plurality of transpose word lines;
- applying a first write voltage to the plurality of transpose bit lines;
- applying a second write voltage to the source line among the plurality of source lines in the memory column different from the first write voltage to provide a write voltage differential across the transpose NVM bit cells in the memory column; and
- applying a third write voltage less than the second write voltage applied to the plurality of source lines not coupled to the transpose NVM bit cells in the memory column.

30. The method of claim 29, wherein applying the third write voltage comprises applying the third write voltage of half or less than the second write voltage of the plurality of source lines not coupled to the transpose NVM bit cells in the memory column.

* * * * *